United States Patent
Matsumoto

(10) Patent No.: US 10,134,565 B2
(45) Date of Patent: Nov. 20, 2018

(54) MULTI CHARGED PARTICLE BEAM EXPOSURE METHOD AND MULTI CHARGED PARTICLE BEAM EXPOSURE APPARATUS

(71) Applicant: NuFlare Technology, Inc., Yokohama-shi, Kanagawa (JP)

(72) Inventor: Hiroshi Matsumoto, Yokohama (JP)

(73) Assignee: NuFlare Technology, Inc., Yokohama-shi, Kanagawa (JP)

( * ) Notice: Subject to any disclaimer, the term of this patent is extended or adjusted under 35 U.S.C. 154(b) by 0 days.

(21) Appl. No.: 15/831,729

(22) Filed: Dec. 5, 2017

(65) Prior Publication Data

US 2018/0166254 A1    Jun. 14, 2018

(30) Foreign Application Priority Data

Dec. 8, 2016 (JP) .................. 2016-238500

(51) Int. Cl.
*H01J 37/302* (2006.01)
*H01J 37/30* (2006.01)
*H01J 37/304* (2006.01)
*H01J 37/317* (2006.01)

(52) U.S. Cl.
CPC ........ *H01J 37/3026* (2013.01); *H01J 37/304* (2013.01); *H01J 37/3007* (2013.01); *H01J 37/3177* (2013.01)

(58) Field of Classification Search
USPC .................................................. 250/492.22
See application file for complete search history.

(56) References Cited

U.S. PATENT DOCUMENTS

| 2013/0068959 | A1* | 3/2013 | Suzuki | H01J 37/244 250/393 |
| 2014/0124684 | A1 | 5/2014 | Matsumoto et al. | |
| 2016/0064178 | A1* | 3/2016 | Matsumoto | H01J 37/045 250/396 R |

FOREIGN PATENT DOCUMENTS

JP    2014-112639    6/2014

\* cited by examiner

*Primary Examiner* — Kiet T Nguyen
(74) *Attorney, Agent, or Firm* — Oblon, McClelland, Maier & Neustadt, L.L.P.

(57) ABSTRACT

A multi charged particle beam exposure method includes calculating an effective irradiation time, for each of a plurality of control irradiation time periods for controlling an irradiation time of each beam in the multi-beams of a charged particle beam, using a blanking error time of each divided shot of a plurality of divided shots, previously acquired, due to an error of blanking control for each divided shot; generating correlation data representing a relation between the control irradiation time and the effective irradiation time; selecting, using the correlation data, for each irradiation position of a target object, the combination of the divided shots corresponding to the effective irradiation time to be closer to each desired irradiation time; and performing exposure, using the multi-beams, based on the combination of the divided shots selected for each irradiation position of the target object.

10 Claims, 20 Drawing Sheets

| No. | k' | tk' |
|---|---|---|
| 1 | 9 | 512Δ |
| 2 | 8 | 256Δ |
| 3 | 7 | 128Δ |
| 4 | 6 | 64Δ |
| 5 | 5 | 32Δ |
| 6 | 4 | 16Δ |
| 7 | 3 | 8Δ |
| 8 | 2 | 4Δ |
| 9 | 1 | 2Δ |
| 10 | 0 | Δ |

FIG.9

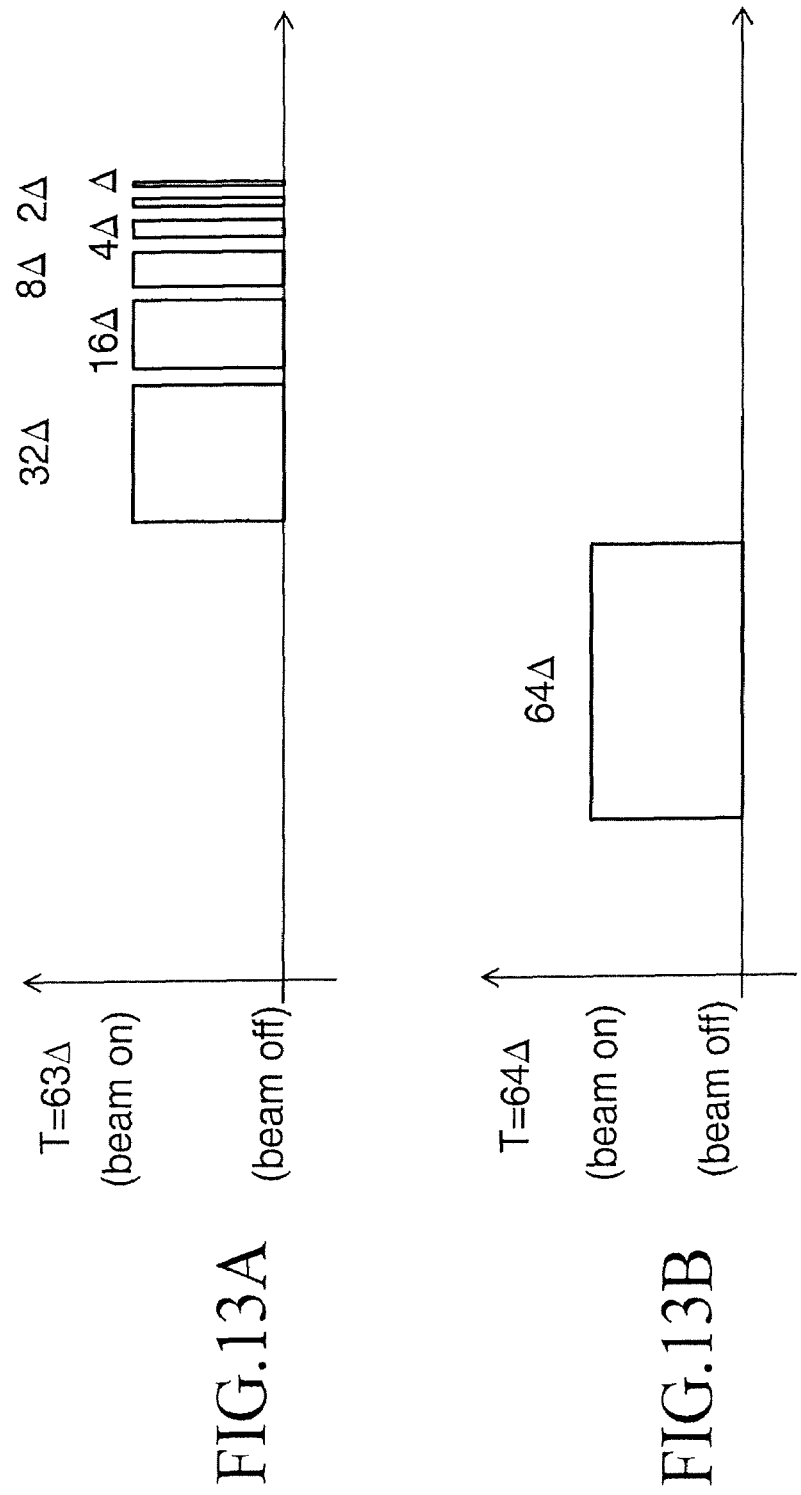

| bit $b_k$ | 0 | 1 | 2 | 3 | 4 | 5 | ... | 9 |
|---|---|---|---|---|---|---|---|---|
| Blanking Error ($\times \Delta$) $\delta t_k$ | -0.7 | -0.4 | -0.3 | -0.2 | -0.2 | -0.2 | ... | -0.2 |

FIG.17

| Tm Control Irradiation Time | Tem Effective Irradiation Time | b0 | b1 | b2 | b3 | b4 | b5 | ... | b9 |
|---|---|---|---|---|---|---|---|---|---|
| 0 | 0 | 0 | 0 | 0 | 0 | 0 | 0 | ... | 0 |
| Δ | 0.3Δ | 1 | 0 | 0 | 0 | 0 | 0 | ... | 0 |
| 2Δ | 1.6Δ | 0 | 1 | 0 | 0 | 0 | 0 | ... | 0 |
| 3Δ | 1.9Δ | 1 | 1 | 0 | 0 | 0 | 0 | ... | 0 |
| 4Δ | 3.8Δ | 0 | 0 | 1 | 0 | 0 | 0 | ... | 0 |
| 5Δ | 4.1Δ | 1 | 0 | 1 | 0 | 0 | 0 | ... | 0 |
| 6Δ | 5.4Δ | 0 | 1 | 1 | 0 | 0 | 0 | ... | 0 |
| 7Δ | 5.7Δ | 1 | 1 | 1 | 0 | 0 | 0 | ... | 0 |
| 8Δ | 7.8Δ | 0 | 0 | 0 | 1 | 0 | 0 | ... | 0 |
| 9Δ | 8.1Δ | 1 | 0 | 0 | 1 | 0 | 0 | ... | 0 |
| 10Δ | 9.4Δ | 0 | 1 | 0 | 1 | 0 | 0 | ... | 0 |
| 11Δ | 9.7Δ | 1 | 1 | 0 | 1 | 0 | 0 | ... | 0 |
| 12Δ | 11.5Δ | 0 | 0 | 1 | 1 | 0 | 0 | ... | 0 |
| 13Δ | 11.8Δ | 1 | 0 | 1 | 1 | 0 | 0 | ... | 0 |
| 14Δ | 13.1Δ | 0 | 1 | 1 | 1 | 0 | 0 | ... | 0 |
| 15Δ | 13.4Δ | 1 | 1 | 1 | 1 | 0 | 0 | ... | 0 |
| 16Δ | 15.8Δ | 0 | 0 | 0 | 0 | 1 | 0 | ... | 0 |
| ... | ... | ... | ... | ... | ... | ... | ... | ... | ... |
| 1023Δ | 1020.2Δ | 1 | 1 | 1 | 1 | 1 | 1 | ... | 1 |

FIG.19

MULTI CHARGED PARTICLE BEAM EXPOSURE METHOD AND MULTI CHARGED PARTICLE BEAM EXPOSURE APPARATUS

CROSS-REFERENCE TO RELATED APPLICATION

This application is based upon and claims the benefit of priority from the prior Japanese Patent Application No. 2016-238500 filed on Dec. 8, 2016 in Japan, the entire contents of which are incorporated herein by reference.

BACKGROUND OF THE INVENTION

Field of the Invention

Embodiments of the present invention relate to a multi charged particle beam exposure method and a multi charged particle beam exposure apparatus, and for example, to a method for correcting an irradiation time in multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" with an electron beam on a wafer, etc.

As a known example of employing the electron beam writing technique, there is a writing apparatus using multi-beams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun individually pass through a corresponding one of a plurality of holes in a mask, performs blanking control for each beam, reduces each unblocked beam by an optical system, and deflects the beam by a deflector to irradiate a desired position on a target object or "sample".

When performing highly precise writing in multi-beam writing, the dose of each beam is individually controlled based on an irradiation time in order to give a specified dose onto each position on a target object. For highly accurately controlling the dose of each beam, blanking control to provide an ON or OFF condition of each beam should be carried out at high speed. Therefore, in a writing apparatus of the multi-beam system, a blanking control circuit for each beam is placed on the blanking aperture array substrate where each blanking electrode of multi-beams is arranged. Blanking controlling is independently performed for each beam. For example, a trigger signal for causing a beam to be ON is sent to control circuits of all the beams. In responsive to the trigger signal, the control circuit of each beam applies a beam-ON voltage to an electrode, and simultaneously, starts counting the irradiation time period by a counter. Then, when the irradiation time has been completed, it applies a beam-OFF voltage. In performing such a control a 10-bit control signal has been used, for example. However, since the space for placing the circuit on the blanking aperture array substrate and the amount of current to be used are restricted, there is no alternative but to have an uncomplicated circuit in regard to the amount of information of the control signal. Therefore, it has been difficult to build in a blanking circuit which can perform an operation at high speed and high precision. Further, installing a blanking control circuit for each beam on the blanking aperture array substrate restricts narrowing the pitch of multi-beams.

Therefore, there is proposed a method of dividing the maximum irradiation time of one shot into a plurality of sub irradiation time periods of a plurality of divided shots, and performing beam irradiation of a desired irradiation time obtained by combining divided shots for each beam (e.g., refer to Japanese Patent Application Laid-open (JP-A) No. 2014-112639). By this method, it becomes unnecessary to provide a counter circuit, etc. in the blanking aperture array substrate, thereby simplifying the circuit configuration.

BRIEF SUMMARY OF THE INVENTION

According to one aspect of the present invention, a multi charged particle beam exposure method includes:

calculating an effective irradiation time, in a case where an irradiation position of each beam in multi-beams of each pass which indicates each exposure processing in multiple exposure is exposed during a control irradiation time being a desired irradiation time by continuously performing a combination of divided shots selected from a plurality of divided shots each having any one of a plurality of sub control irradiation time periods preset and being corresponding to the control irradiation time onto a same irradiation position, for each of a plurality of control irradiation time periods for controlling an irradiation time of each beam in the multi-beams of a charged particle beam, using a blanking error time of each divided shot of the plurality of divided shots, previously acquired, due to an error of blanking control for the each divided shot;

generating correlation data which represents a relation between the control irradiation time and the effective irradiation time;

selecting, using the correlation data, for each irradiation position of a target object, the combination of the divided shots corresponding to the effective irradiation time to be closer to the each desired irradiation time; and performing exposure, using the multi-beams, based on the combination of the divided shots selected for the each irradiation position of the target object.

According to another aspect of the present invention, a multi charged particle beam exposure apparatus includes:

an effective irradiation time calculation circuit configured to calculate an effective irradiation time, in a case where an irradiation position of each beam in multi-beams of each pass which indicates each exposure processing in multiple exposure is exposed during a control irradiation time being a desired irradiation time by continuously performing a combination of divided shots selected from a plurality of divided shots each having anyone of a plurality of sub control irradiation time periods preset and being corresponding to the control irradiation time onto a same irradiation position, for each of a plurality of control irradiation time periods for controlling an irradiation time of each beam in the multi-beams of a charged particle beam, using a blanking error time of each divided shot of the plurality of divided shots, previously acquired, due to an error of blanking control for the each divided shot;

a generation circuit configured to generate correlation data which represents a relation between the control irradiation time and the effective irradiation time;

a selection circuit configured to select, using the correlation data, for each irradiation position of a target object, the combination of the divided shots corresponding to the effective irradiation time to be closer to the each desired irradiation time; and an exposure mechanism configured to perform exposure, using the multi-beams, based on the combination of the divided shots selected for the each irradiation position of the target object.

BRIEF DESCRIPTION OF THE DRAWINGS

FIG. 9 shows an example of divided shots of multi-beams according to the first embodiment;

FIGS. 13A and 13B show examples of a set of divided shots according to a comparative example of the first embodiment;

FIG. 17 is a table showing a blanking error time δtk with respect to each divided shot according to the first embodiment;

FIG. 19 is a chart showing a relation among a control irradiation time, an effective irradiation time, and a set/combination of divided shots according to the first embodiment.

DETAILED DESCRIPTION OF THE INVENTION

For blanking control of an electron beam such as multi-beams, it is necessary, as described above, to perform an operation of switching voltages to be applied to a pair of electrodes. However, when switching such voltages, the blanking waveform does not become an ideal rectangle, and a delay occurs at the rise and fall of the voltage switching. Therefore, compared to the irradiation time on control, the actual irradiation time includes errors. For example, in a variable-shaped beam (VSB) writing apparatus employing a single beam, a blanking control is provided for a single beam by a pair of electrodes during each desired irradiation time for one shot. Therefore, as a single beam is used, it is easy to realize a high speed blanking electrode and driving circuit. Furthermore, since a short shot time which causes the resist to be insensitive is not used because gray-beam writing is not performed, it is possible to perform the blanking control such that settling waveforms of beam ON and beam OFF do not overlap with each other. With respect to such an apparatus, it is known that errors of the exposure time control occur uniformly without depending on the exposure time. Therefore, it is possible to uniformly correct the irradiation time with treating such an error as an offset time. However, if divided shots described above are used in a multi-beam writing apparatus, the irradiation time in one divided shot may sometimes be extremely short. Therefore, it turns out that errors do not occur uniformly in the multi-beams unlike the single beam case. Thus, correction processing similar to that of a single beam case cannot be performed, and therefore, an error is included in the irradiation time.

Embodiments below describe an exposure apparatus and method which can correct a blanking error in multi-beam exposure.

Embodiments below describe a configuration using an electron beam as an example of a charged particle beam. The charged particle beam is not limited to the electron beam, and other charged particle beam such as an ion beam may also be used. Moreover, Embodiments below describe a configuration using a writing apparatus as an example of an exposure apparatus. The exposure apparatus is not limited to the writing apparatus, and may be an apparatus, such as an inspection apparatus, which irradiates a target object with charged particle beams.

First Embodiment

Figure 1:
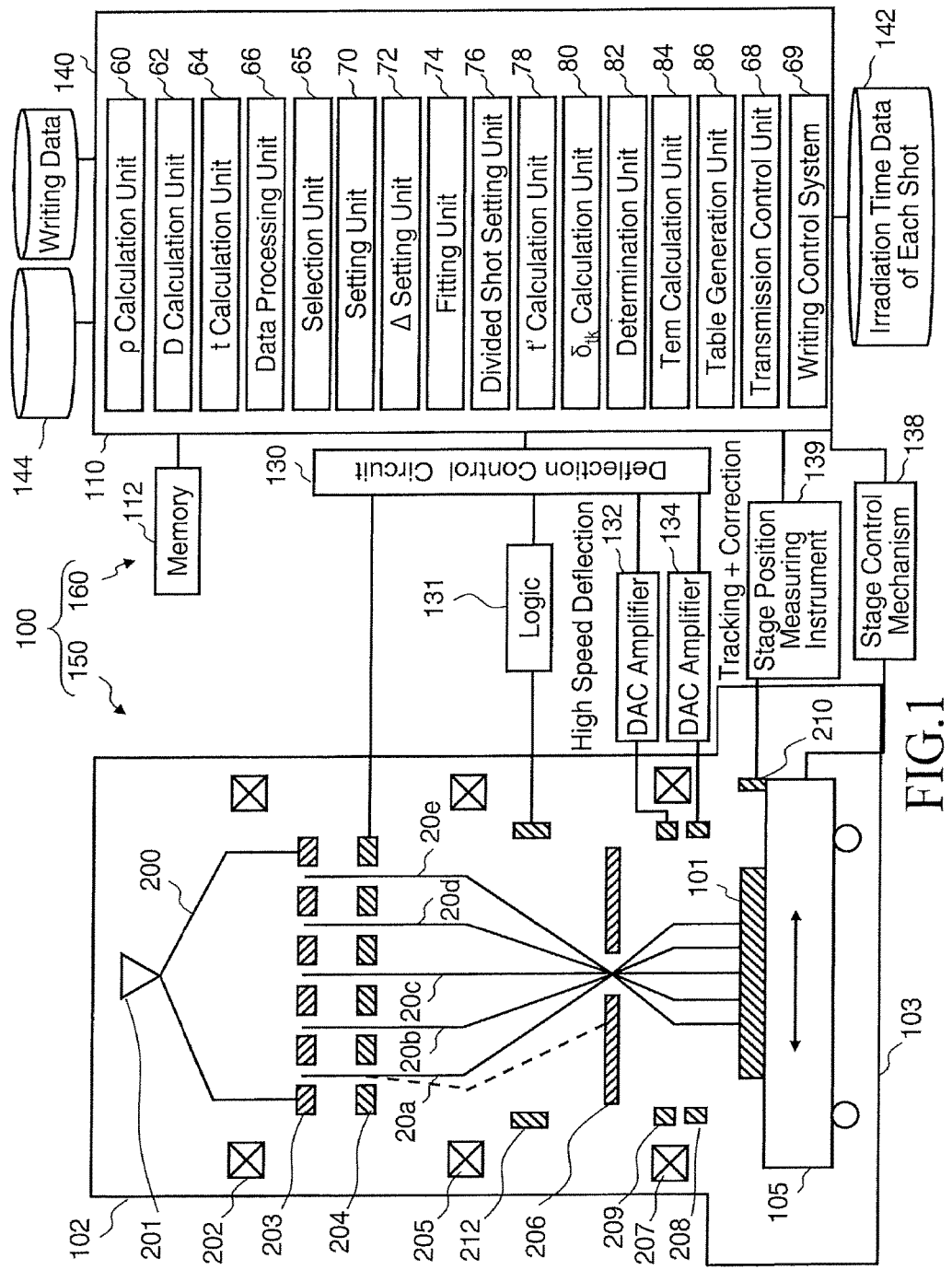
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi charged particle beam writing apparatus and an example of a multi charged particle beam exposure apparatus. The writing mechanism 150 (exposure mechanism) includes an electron optical column 102 (electron beam column) and a writing chamber 103. In the electron optical column 102, there are arranged an electron gun 201, an illumination lens 202, a shaping aperture array substrate 203, a blanking aperture array mechanism 204, a reducing lens 205, a limiting aperture substrate 206, an objective lens 207, a deflector 208, a deflector 209, and a common blanking deflector 212. In the writing chamber 103, there is arranged an XY stage 105. On the XY stage 105, a target object or "sample" 101 such as a mask serving as a writing target substrate is placed when writing (exposure) is performed. The target object 101 is, for example, an exposure mask used when fabricating semiconductor devices, or a semiconductor substrate (silicon wafer) for fabricating semiconductor devices. Moreover, the target object 101 may be, for example, a mask blank on which resist has been applied and nothing has yet been written. Further, on the XY stage 105, there is placed a mirror 210 for measuring the position of the XY stage 105.

The control system circuit 160 includes a control computer 110, a memory 112, a deflection control circuit 130, a logic circuit 131, DAC (digital-analog converter) amplifier units 132 and 134, a stage control mechanism 138, a stage position measuring instrument 139, and storage devices 140, 142 and 144 such as magnetic disk drives. The control computer 110, the memory 112, the deflection control circuit 130, the logic circuit 131, the stage control mechanism 138, the stage position measuring instrument 139, and the storage devices 140, 142 and 144 are connected with each other through a bus (not shown). The deflection control circuit 130 is connected to the DAC amplifier units 132 and 134, the logic circuit 131, and the blanking aperture array mechanism 204. The output of the DAC amplifier unit 132 is connected to the deflector 209. The output of the DAC amplifier unit 134 is connected to the deflector 208. The output of the logic circuit 131 is connected to the common blanking deflector 212. The stage position measuring instrument 139 irradiates the mirror 210 on the XY stage 105 with a laser light, and receives a reflected light from the mirror 210. Then, the stage position measuring instrument 139 measures the position of the XY stage 105 by using information of the reflected light.

In the control computer 110, there are arranged a pattern area density ρ calculation unit 60, a dose D calculation unit 62, an irradiation time t calculation unit 64, a selection unit 65, a data processing unit 66, a transmission control unit 68, a writing control unit 69, a setting unit 70, a Δ setting unit 72, a fitting unit 74, a divided shot setting unit 76, a t' calculation unit 78, a $δ_{tk}$ calculation unit 80, a determination unit 82, an effective irradiation time (Tem) calculation unit 84, and a table generation unit 86. Each of the " . . . units" such as the pattern area density ρ calculation unit 60, the dose D calculation unit 62, the irradiation time t calculation unit 64, the selection unit 65, the data processing unit 66, the transmission control unit 68, the writing control unit 69, the setting unit 70, the Δ setting unit 72, the fitting unit 74, the divided shot setting unit 76, the t' calculation unit 78, the $δ_{tk}$ calculation unit 80, the determination unit 82, the Tem calculation unit 84, and the table generation unit 86 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Data input/output to/from the pattern area density ρ calculation unit 60, the dose D calculation unit 62, the irradiation time t calculation unit 64, the selection unit 65, the data processing unit 66, the transmission control unit 68, the writing control unit 69, the setting unit 70, the Δ setting unit 72, the fitting unit 74, the divided shot setting unit 76, the t' calculation unit 78, the $δ_{tk}$ calculation unit 80, the determination unit 82, the Tem calculation unit 84, and the table generation unit 86, and data being operated are stored in the memory 112 each time.

Moreover, writing data is input from the outside of the writing apparatus 100, and stored in the storage device 140. The writing data usually defines information on a plurality of figure patterns to be written. Specifically, it defines a figure code, coordinates, size, etc. for each figure pattern.

FIG. 1 shows configuration elements necessary for describing the first embodiment. It should be understood that other configuration elements generally necessary for the writing apparatus 100 may also be included therein.

Figure 2:
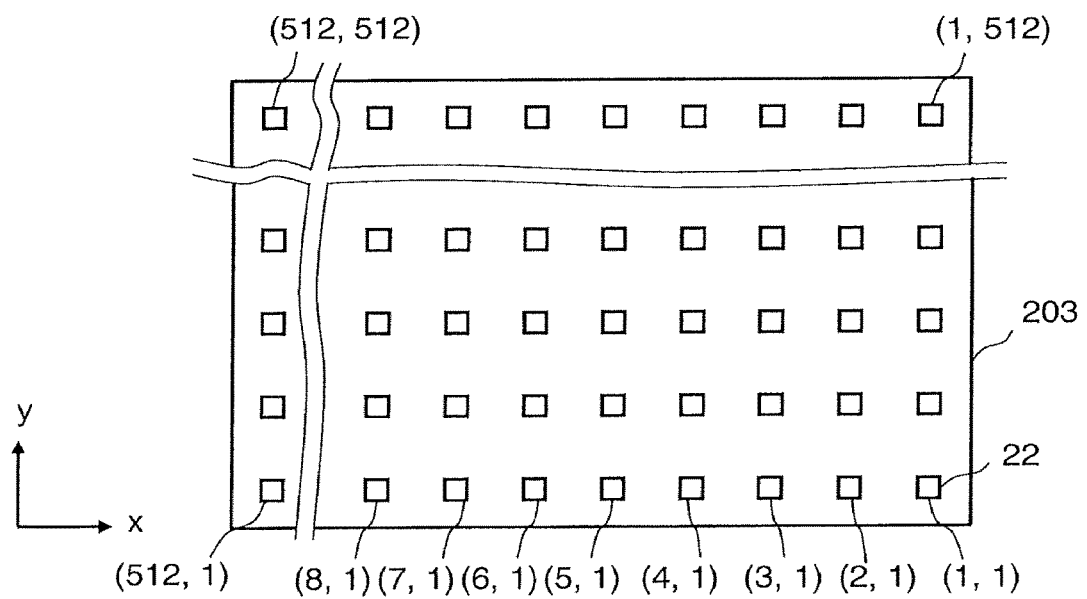
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings, apertures) 22 of p rows long (length in the y direction) and q columns wide (width in the x direction) (p≥2, q≤2) are formed, like a matrix, at a predetermined arrangement pitch in the shaping aperture array substrate 203. In FIG. 2, for example, holes 22 of 512 (rows of holes arrayed in the y direction)×512 (columns of holes arrayed in the x direction) are formed. Each of the holes 22 is a quadrangle (rectangle) having the same dimension and shape. Alternatively, each of the holes 22 may be a circle with the same diameter. Multi-beams 20 are formed by making portions of an electron beam 200 individually pass through a corresponding hole of a plurality of holes 22. Shown here is the case where the holes 22 of two or more rows and columns are arranged horizontally and vertically (in the x and y directions), but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. Moreover, the method of arranging the holes 22 is not limited to the case of FIG. 2 where holes are arranged like a grid in the length and width directions. For example, with respect to the kth and the (k+1)th rows which are arrayed (accumulated) in the length direction (y direction), each hole in the kth row and each hole in the (k+1)th row may be mutually displaced in the width direction (x direction) by a dimension "a". Similarly, with respect to the (k+1) th and the (k+2) th rows which are arrayed (accumulated) in the length direction (y direction), each hole in the (k+1) th row and each hole in the (k+2)th row may be mutually displaced in the width direction (x direction) by a dimension "b", for example.

Figure 3:
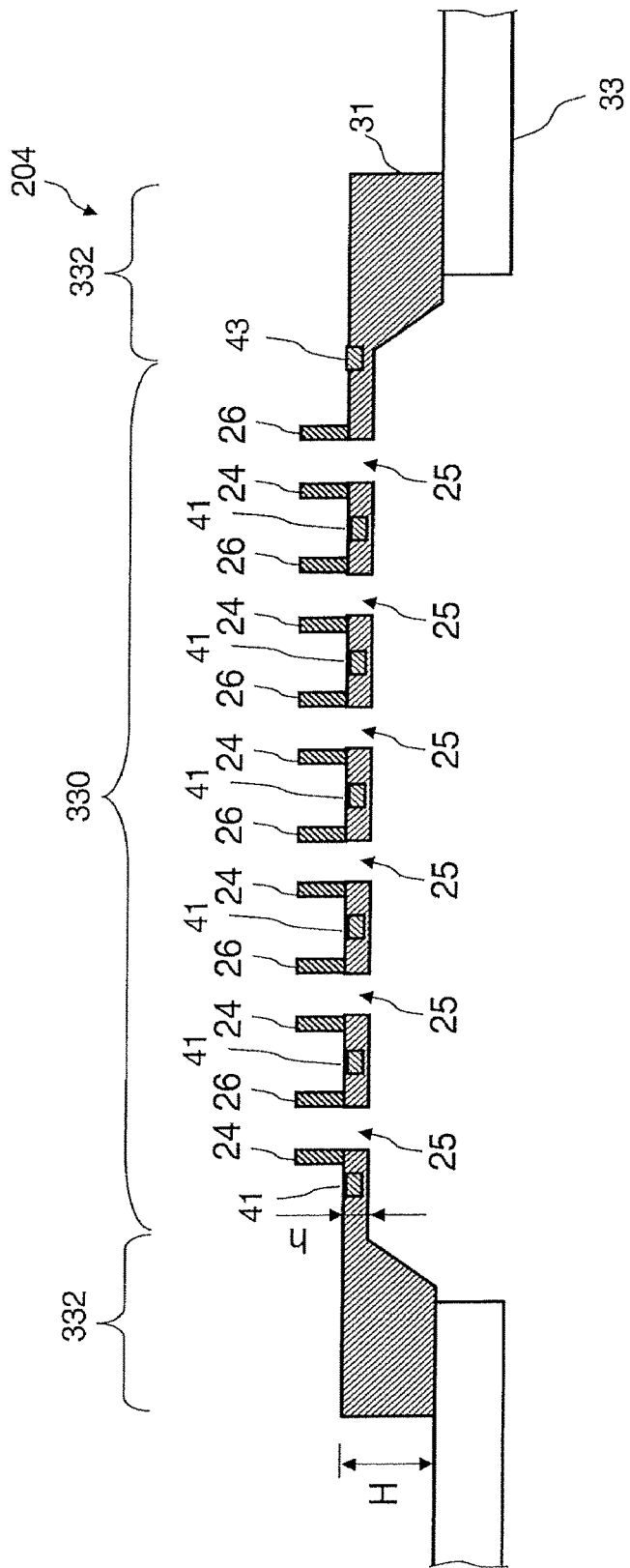
FIG. 3 is a sectional view showing a configuration of a blanking aperture array mechanism according to the first embodiment.

FIG. 3 is a sectional view showing a configuration of a blanking aperture array mechanism according to the first embodiment.

Figure 4:
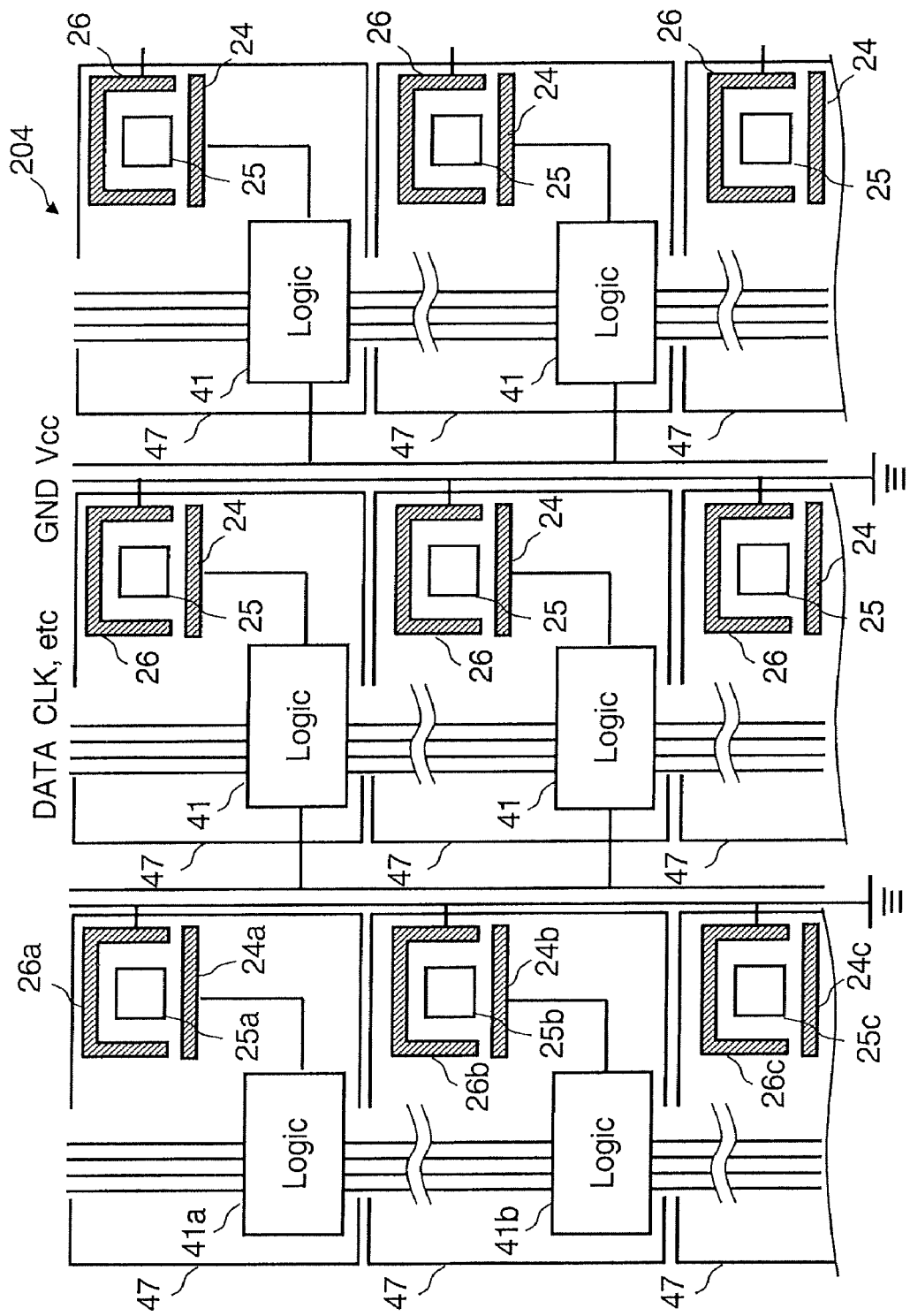
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 3 is not in accordance with that of FIG. 4. With regard to the structure of the blanking aperture array mechanism 204, as shown in FIG. 3, a semiconductor substrate 31 made of silicon, etc. is placed on a support table 33. The central part of the substrate 31 is shaved from the back side, and made into a membrane region 330 (first region) having a thin film thickness h. The circumference surrounding the membrane region 330 is a circumferential region 332 (second region) having a thick film thickness H. The upper surface of the membrane region 330 and the upper surface of the circumferential region 332 are formed to be flush or substantially flush in height with each other. At the back side of the circumferential region 332, the substrate 31 is supported on the support table 33. The central part of the support table 33 is open, and the membrane region 330 is located at this opening region.

In the membrane region 330, passage holes 25 (openings) through each of which a corresponding one of multi-beams passes are formed at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multi-beams passes. Moreover, in the membrane region 330 of the substrate 31, there are arranged a plurality of electrode pairs each composed of two electrodes being opposite each other with respect to a corresponding one of a plurality of passage holes 25. Specifically, in the membrane region 330, as shown in FIGS. 3 and 4, each pair (blanker: blanking deflector) of the control electrode 24 and the counter electrode 26 for blanking deflection is arranged close to a corresponding passage hole 25 in a manner such that the electrodes 24 and 26 are opposite each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 4, n-bit (e.g., 1-bit) parallel lines for control signals are connected to each control circuit 41. In addition to the n-bit parallel lines for controlling signals, lines for a clock signal, a read signal, a shot signal, power supply, and the like are connected to each control circuit 41. Alternatively, a part of the parallel lines may be used as the lines for a clock signal, a read signal, a shot signal, power supply, and the like. An individual blanking mechanism 47 composed of the control electrode 24, the counter electrode 26, and the control circuit 41 is configured for each of the multi-beams. In the example of FIG. 3, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped, for example, per row or per column, and the control circuits 41 in each group are connected in series as shown in FIG. 4. Then, the pad 43 arranged for each group sends a signal to the control circuits 41 in the group concerned. Specifically, a shift register to be described later is arranged in each control circuit 41, and for example, shift registers in the control circuits 41 for beams in the same row in p×q multiple beams, for example, are connected in series. For example, control signals for beams in the same row in the p×q multiple beams are transmitted in series, and, for example, a control signal for each beam is stored in a corresponding control circuit 41 by p clock signals totally.

Figure 5:
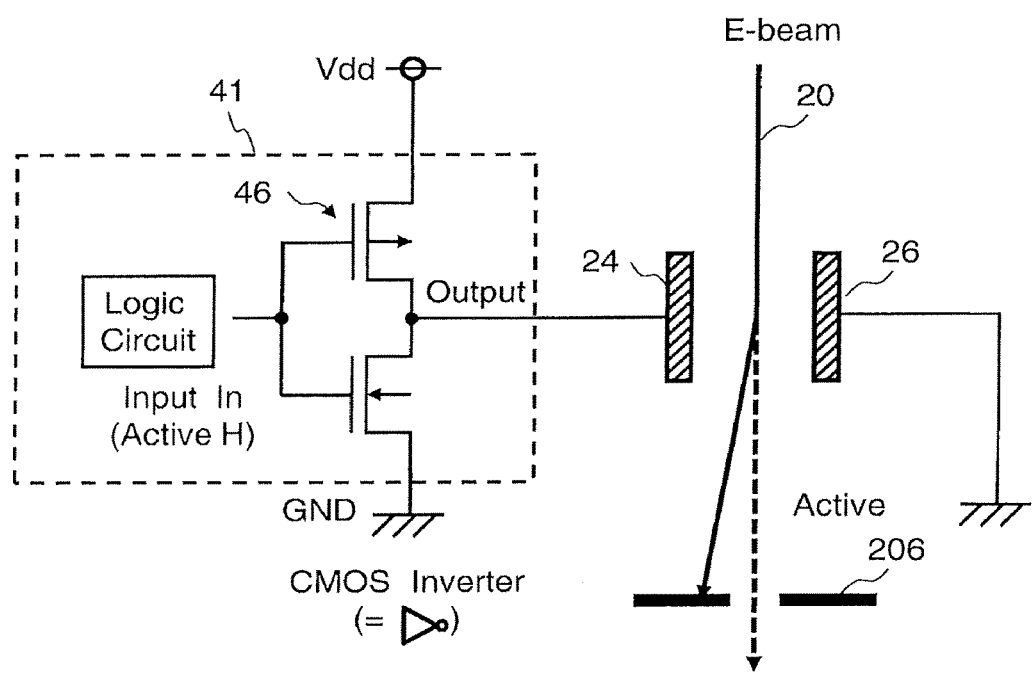
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that the control electrode 24 and the corresponding counter electrode 26 are opposite each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby controlled to be in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby controlled to be in a beam ON condition by making the beam concerned pass through the limiting aperture substrate 206.

The electron beam 20 passing through a corresponding passage hole is deflected by a voltage independently applied to a pair of the control electrode 24 and the counter electrode 26. Blanking control is performed by this deflection. Specifically, a pair of the control electrode 24 and the counter electrode 26 individually provides blanking deflection of a corresponding beam of multi-beams by an electric potential switchable by the CMOS inverter circuit which serves as a corresponding switching circuit. Thus, each of a plurality of blankers performs blanking deflection of a corresponding beam in the multi-beams having passed through a plurality of holes 22 (openings) in the shaping aperture array substrate 203.

Figure 6:
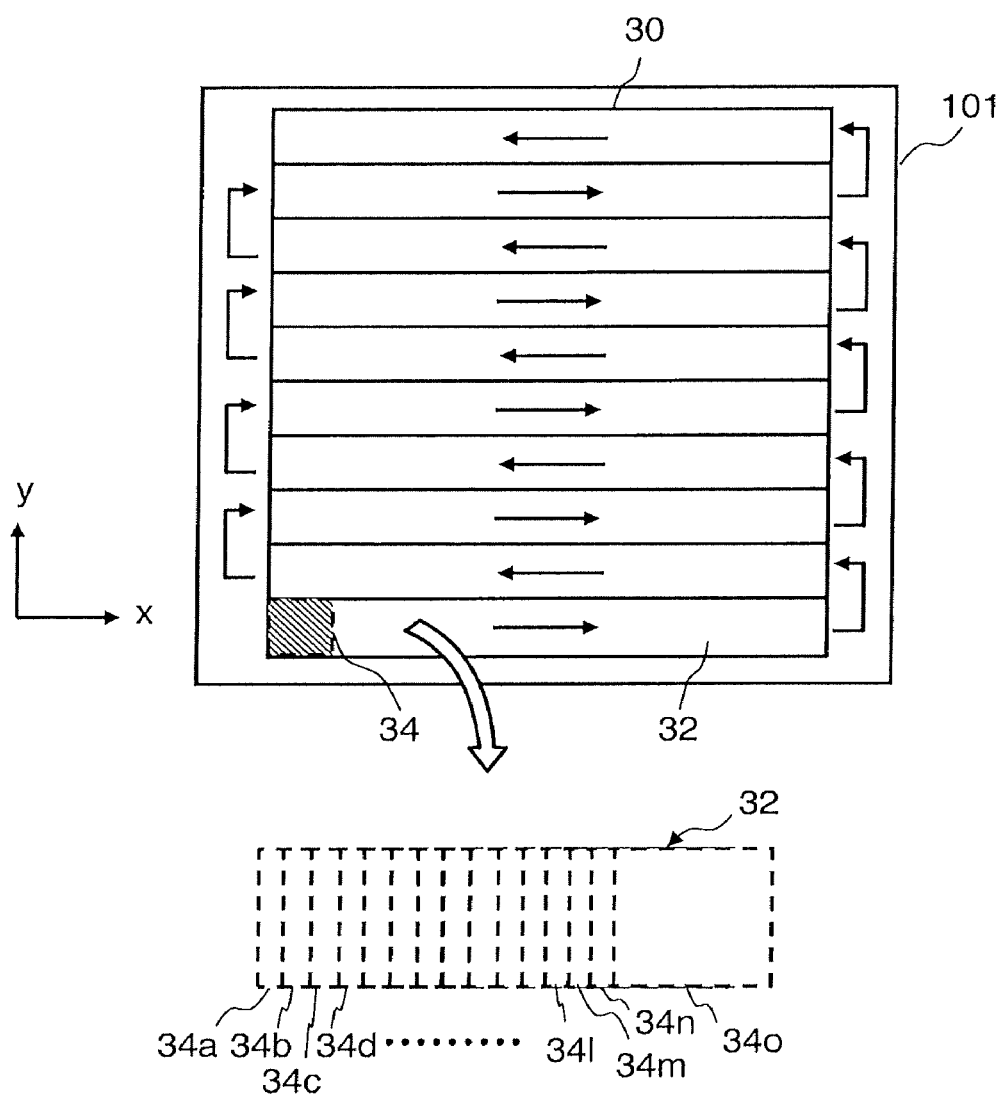
FIG. 6 is a conceptual diagram explaining an example of a writing operation according to the first embodiment.

FIG. 6 is a conceptual diagram explaining an example of a writing operation according to the first embodiment. As shown in FIG. 6, a writing region 30 of the target object 101 is virtually divided by a predetermined width in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position further left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing similarly advances in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot of multi-beams having been formed by passing through the holes 22 in the shaping aperture array substrate 203.

Figure 7:
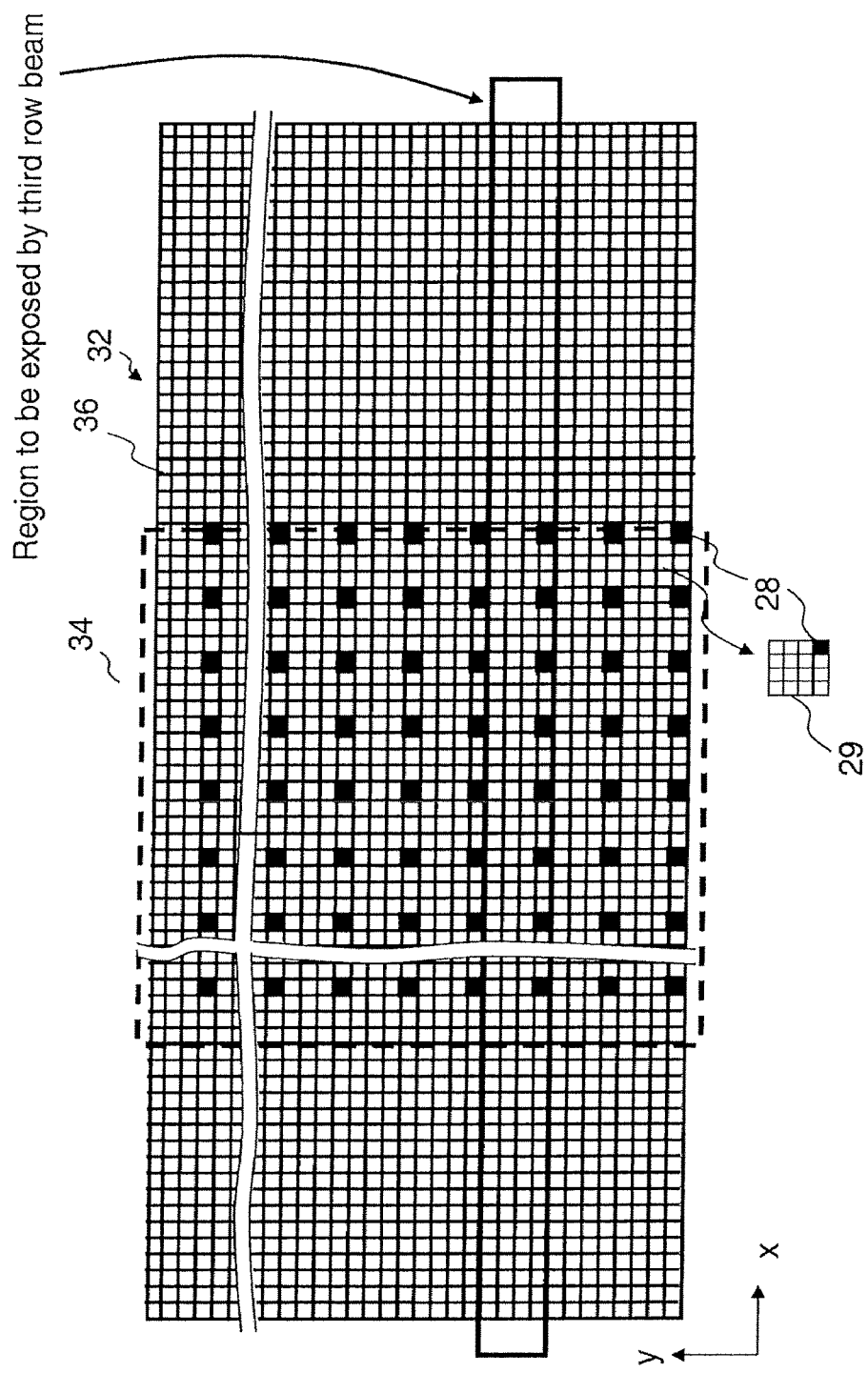
FIG. 7 shows an example of an irradiation region of multi-beams and a pixel to be written (writing pixel) according to the first embodiment.

FIG. 7 shows an example of an irradiation region of multi-beams and a pixel to be written (writing pixel) according to the first embodiment. In FIG. 7, the stripe region 32 is divided into a plurality of mesh regions by the beam size of each of the multi-beams, for example. Each mesh region serves as a writing pixel 36 (unit irradiation region, irradiation position, or writing position). The size of the writing pixel 36 is not limited to the beam size, and may be an arbitrary size regardless of the beam size. For example, it may be 1/n (n being an integer of 1 or more) of the beam size. FIG. 7 shows the case where the writing region of the target object 101 is divided, for example, in the y direction, into a plurality of stripe regions 32 by the width size being substantially the same as the size of the irradiation region 34 (writing field) which can be irradiated with one irradiation of the multi-beams 20. The width of the stripe region 32 is not limited to this. Preferably, the width of the stripe region 32 is n times (n being an integer of 1 or more) the size of the irradiation region 34. FIG. 7 shows the case of multi-beams of 512 (rows)×512 (columns) being simplified to 8×8. In the irradiation region 34, there are shown a plurality of pixels 28 (beam writing positions) which can be irradiated with one shot of the multi-beams 20. In other words, the pitch between adjacent pixels 28 is the pitch between beams of the multi-beams. In the example of FIG. 7, one grid 29 is a square region surrounded by four adjacent pixels 28 at four corners and including one of the four pixels 28. In the case of FIG. 7, each grid 29 is composed of 4×4 pixels.

Figure 8:
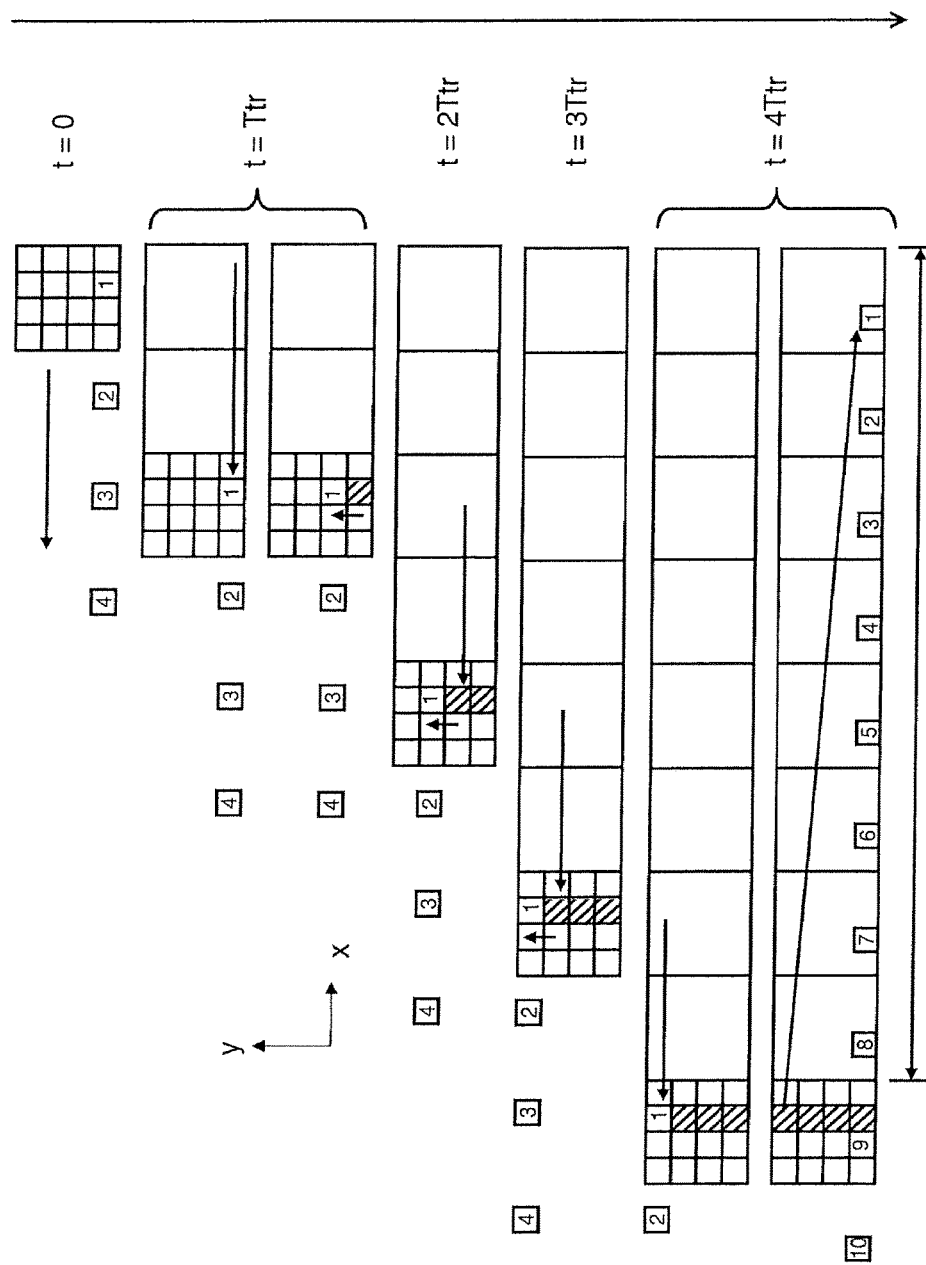
FIG. 8 illustrates an example of a writing method of multi-beams according to the first embodiment.

FIG. 8 illustrates an example of a writing method of multi-beams according to the first embodiment. FIG. 8 shows some grids to be written by respective beams at the coordinates (1, 3), (2, 3), (3, 3), ... , (512, 3) in the third row from the bottom in the multi-beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multi-beams 20 by the deflector 208. In other words, tracking control is performed. In the example of FIG. 8, one tracking cycle is executed by writing (exposing) four pixels while moving the distance of eight beam pitches.

Specifically, the stage position measuring instrument 139 measures the position of the XY stage 105 by irradiating the mirror 210 with a laser and receiving a reflected light from the mirror 210. The measured position of the XY stage 105 is output to the control computer 110. In the control computer 110, the writing control unit 69 outputs the position information on the XY stage 105 to the deflection control circuit 130. In accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 irradiates each pixel 36 with a corresponding beam in an ON condition in the multi-beams 20 during a writing time (irradiation time or exposure time) corresponding to each pixel 36 within a maximum irradiation time Ttr of the irradiation time of each of the multi-beams of the shot concerned. However, according to the first embodiment, a shot having the maximum irradiation time Ttr is divided into groups of divided shots (sub shots: an example of a shot) each having a different one of a plurality of irradiation time periods. Then, a set of divided shots, where a sum of irradiation time periods has been selected to be equivalent to the writing time of the pixel 36 concerned from the groups of divided shots, is performed continuously or discontinuously.

FIG. 9 shows an example of divided shots of multi-beams according to the first embodiment. In FIG. 9, a maximum irradiation time Ttr of one shot to each pixel 36 is divided into n divided shots each having a different irradiation time and irradiating the same pixel 36. First, a gray-scale value Ntr is defined by dividing the maximum irradiation time Ttr by a quantization unit $\Delta$ (gray-scale value resolution). For example, when n=10, the maximum irradiation time Ttr is divided into ten divided shots. In the case of defining the gray-scale value Ntr by n-digit binary numbers, it is preferable to previously set the quantization unit $\Delta$ such that the gray-scale value Ntr is 1023 (Ntr=1023). By this, the maximum irradiation time Ttr is 1023$\Delta$ (Ttr=1023$\Delta$). As shown in FIG. 9, each of n divided shots has one of the irradiation time of $2^{k'}\Delta$ where the digit number k' is one of 0 to 9 (k'=0, ... , 9). In other words, it has the irradiation time of one of 512$\Delta$ (=$2^9\Delta$), 256$\Delta$ (=$2^8\Delta$), 128$\Delta$ (=$2^7\Delta$), 64$\Delta$ (=$2^6\Delta$), 32$\Delta$ (=$2^5\Delta$), 16$\Delta$ (=$2^4\Delta$), 8$\Delta$ (=$2^3\Delta$), 4$\Delta$ (=$2^2\Delta$), 2$\Delta$ (=$2^1\Delta$), and $\Delta$ (=$2^0\Delta$). That is, one shot of the multi-beams is divided into a divided shot with the irradiation time tk' of 512$\Delta$, a divided shot with the irradiation time tk' of 256$\Delta$, a divided shot with the irradiation time tk' of 128$\Delta$, a divided shot with the irradiation time tk' of 64$\Delta$, a divided shot with the irradiation time tk' of 32$\Delta$, a divided shot with the irradiation time tk' of 16$\Delta$, a divided shot with the irradiation time tk' of 8$\Delta$, a divided shot with the irradiation time tk' of 4$\Delta$, a divided shot with the irradiation time tk' of 2$\Delta$, and a divided shot with the irradiation time tk' of $\Delta$.

Therefore, an arbitrary irradiation time t (=N$\Delta$) for irradiating each pixel 36 can be defined by a set having at least one divided shot of a group of divided shots each having a corresponding one of irradiation time periods each defined by 512$\Delta$ (=29$\Delta$), 256$\Delta$ (=28$\Delta$), 128$\Delta$ (=27$\Delta$), 64$\Delta$ (=26$\Delta$) 32$\Delta$ (=25$\Delta$), 16$\Delta$ (=$2^4\Delta$), 8$\Delta$ (=$2^3\Delta$), 4$\Delta$ (=$2^2\Delta$), 2$\Delta$ (=$2^1\Delta$), or $\Delta$ (=$2^0\Delta$) except for the case of the irradiation time being zero.

Figure 10:
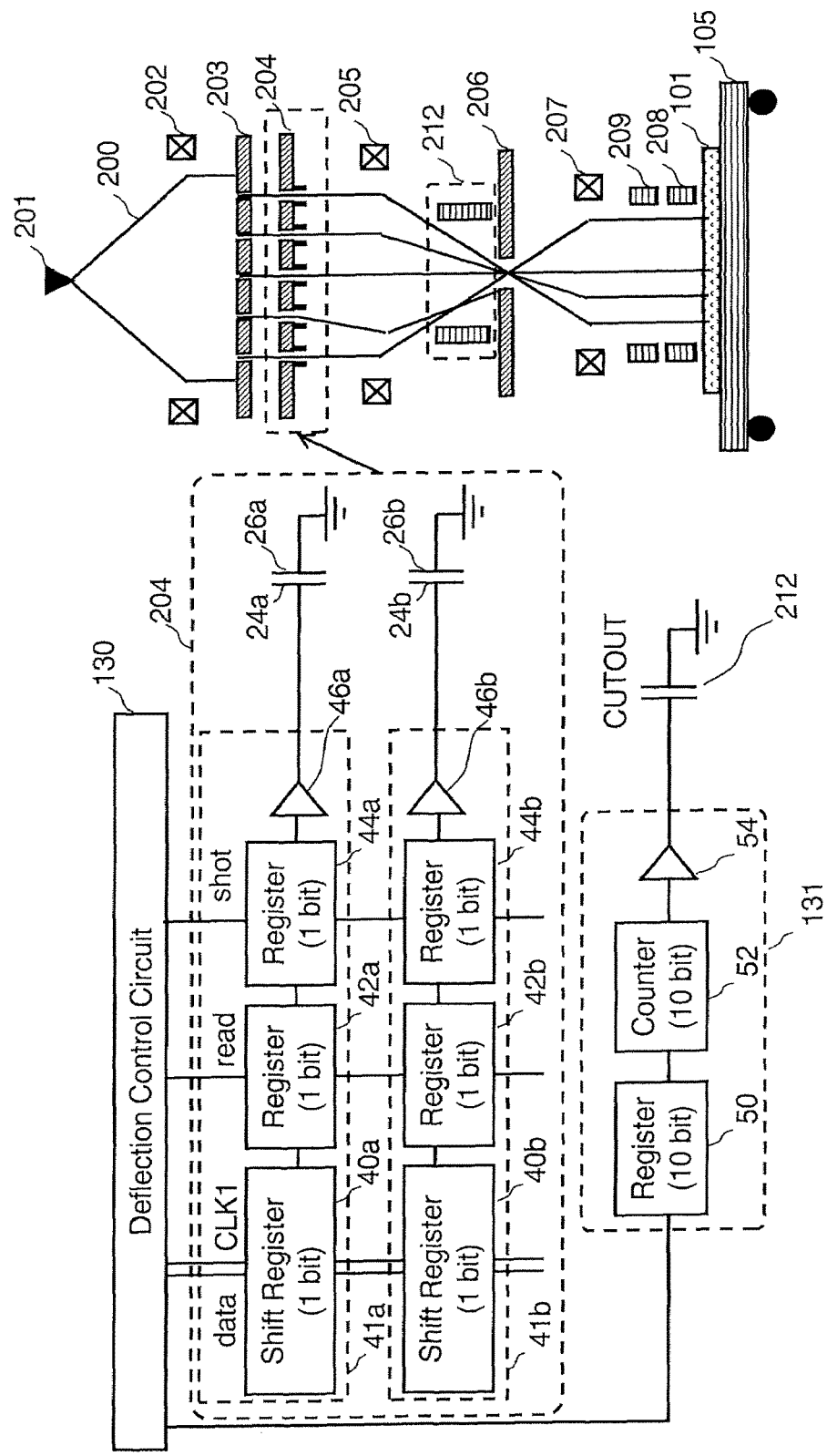
FIG. 10 is a conceptual diagram showing the internal configuration of an individual blanking control circuit and a common blanking control circuit according to the first embodiment.

FIG. 10 is a conceptual diagram showing the internal configuration of an individual blanking control circuit and a common blanking control circuit according to the first embodiment. As shown in FIG. 10, in each control circuit 41 for individual blanking control placed in the blanking aperture array mechanism 204 inside the body of the writing apparatus 100, there are arranged a shift register 40, a register 42, a register 44, and the amplifier 46. Individual blanking control for each beam is performed by a control signal of one bit, for example. That is, for example, a 1-bit control signal is input/output to/from the shift register 40, the registers 42 and 44, and the amplifier 46. Since the amount of information of the control signal is small, the installation area of the control circuit can be made small. In other words, even when the control circuit is placed in the blanking aperture array mechanism 204 whose installation space is small, more beams can be arranged at a smaller beam pitch. This increases the amount of current passing through the blanking plate, and therefore, improves the writing throughput.

Moreover, in the logic circuit 131 for common blanking, there are arranged a register 50, a counter 52, and an amplifier 54. These do not simultaneously perform several different controls, and therefore, it is sufficient to use one circuit to perform ON/OFF control. Accordingly, even when a circuit for a high speed response is arranged, no problem occurs with respect to restriction on the installation space and the current to be used in the circuit. Therefore, the amplifier 54 operates at very high speed compared to the amplifier 46 that can be implemented in the blanking aperture array mechanism 204. The amplifier 54 is controlled by a 10-bit control signal, for example. That is, for example, a 10-bit control signal is input/output to/from the register 50 and the counter 52.

According to the first embodiment, blanking control of each beam is performed by using both the beam ON/OFF control by each logic circuit 41 for individual blanking control described above and the beam ON/OFF control by the logic circuit 131 for common blanking control that collectively performs blanking control of the entire multi-beams.

Figure 11:
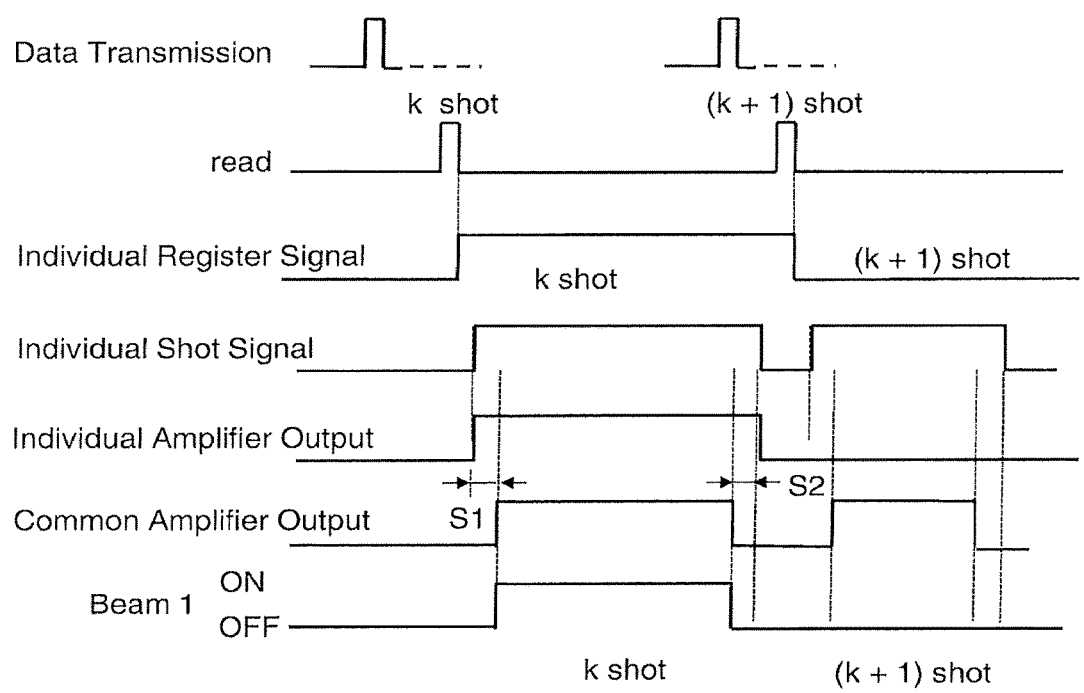
FIG. 11 is a timing chart showing a beam ON/OFF switching operation with respect to a divided shot according to the first embodiment.

FIG. 11 is a timing chart showing a beam ON/OFF switching operation with respect to a divided shot according to the first embodiment. FIG. 11 shows one beam (beam 1) in a plurality of beams configuring the multi-beams 20, for example. Here, the step of the k-th and the (k+1) th divided shots of the beam 1 is shown. In the irradiation time array data, the k-th shot is indicated by "1", and the (k+1) th shot is indicated by "0", for example.

The shift registers 40 in the control circuits 41 for beams in the same row, for example, in p×q multiple beams are connected in series. For example, irradiation time data (ON/OFF control signal) of divided shots of beams in the same row in p×q multiple beams are transmitted in series. Then, for example, the transmitted irradiation time data of each beam is stored in a corresponding shift register 40 by p clock signals totally.

Then, responsive to input of a read signal from the deflection control circuit 130, the individual register 42 reads and stores an ON/OFF signal, based on the stored k-th shot data (1 bit). Moreover, irradiation time data (10 bits) of the k-th shot is transmitted from the deflection control circuit 130, and stored in the register 50 for common blanking control.

Next, an individual shot signal of the k-th shot is output from the deflection control circuit 130 to the individual registers 44 of all the beams. Thereby, the individual register 44 for each beam maintains data stored in the individual register 42 only during the time of the ON condition of the individual shot signal, and outputs a beam ON signal or a beam OFF signal to the individual amplifier 46 in accordance with a maintained ON/OFF signal. Instead of the individual shot signal, a load signal for keeping loading and a reset signal for resetting stored information may be output to the individual register 44. The individual amplifier 46 applies a beam ON voltage or a beam OFF voltage to the control electrode 24 in accordance with an input beam ON signal or beam OFF signal. On the other hand, after the individual shot signal, a common shot signal of the k-th shot is output from the deflection control circuit 130 to the counter 52 for common blanking control. The counter 52 performs counting only during the time indicated by the ON/OFF control signal stored in the register 50, and, during this period, outputs a beam ON signal to the common amplifier 54. The common amplifier 54 applies a beam ON voltage to the deflector 212 only during the time of inputting a beam ON signal from the counter 52.

Compared with ON/OFF switching of the individual blanking mechanism 47, a common blanking mechanism performs ON/OFF switching after a voltage stabilization time (settling time) S1/S2 of the amplifier 46 has passed. In the case of FIG. 11, after the individual amplifier has become ON and the settling time S1 of the individual amplifier 46 at switching from OFF to ON has passed, the common amplifier 54 becomes ON. Thereby, beam irradiation at an unstable voltage at the time of rise of the individual amplifier 46 can be avoided. Then, the common amplifier 54 becomes OFF after the irradiation time of the k-th shot being a target has passed. Consequently, in the case of both the individual amplifier 46 and the common amplifier 54 being in the ON condition, an actual beam becomes ON to irradiate the target object 101. Therefore, preferably, it is controlled such that the ON time period of the common amplifier 54 is the irradiation time of the actual beam. On the other hand, in the case of the common amplifier 54 becoming ON when the individual amplifier 46 is OFF, preferably, after the individual amplifier 46 becomes OFF and the settling time S2 of the individual amplifier 46 at switching from ON to OFF has passed, the common amplifier 54 becomes ON. Thereby, beam irradiation at an unstable voltage at the fall time of the individual amplifier 46 can be avoided.

As described above, by continuously performing divided shots in the same group in one tracking cycle, the shift cycle of the group concerned is carried out.

In the example described above, it is controlled not to include an error due to voltage stabilization time (settling time: stabilization time period) at rise and fall time of the electric potential of the individual amplifier 46, by controlling the irradiation time by using the common amplifiers 54. However, voltage stabilization time (settling time: stabilization time period) at rise and fall of the electric potential is needed even for the common amplifier 54.

Figures 12A, 12B:
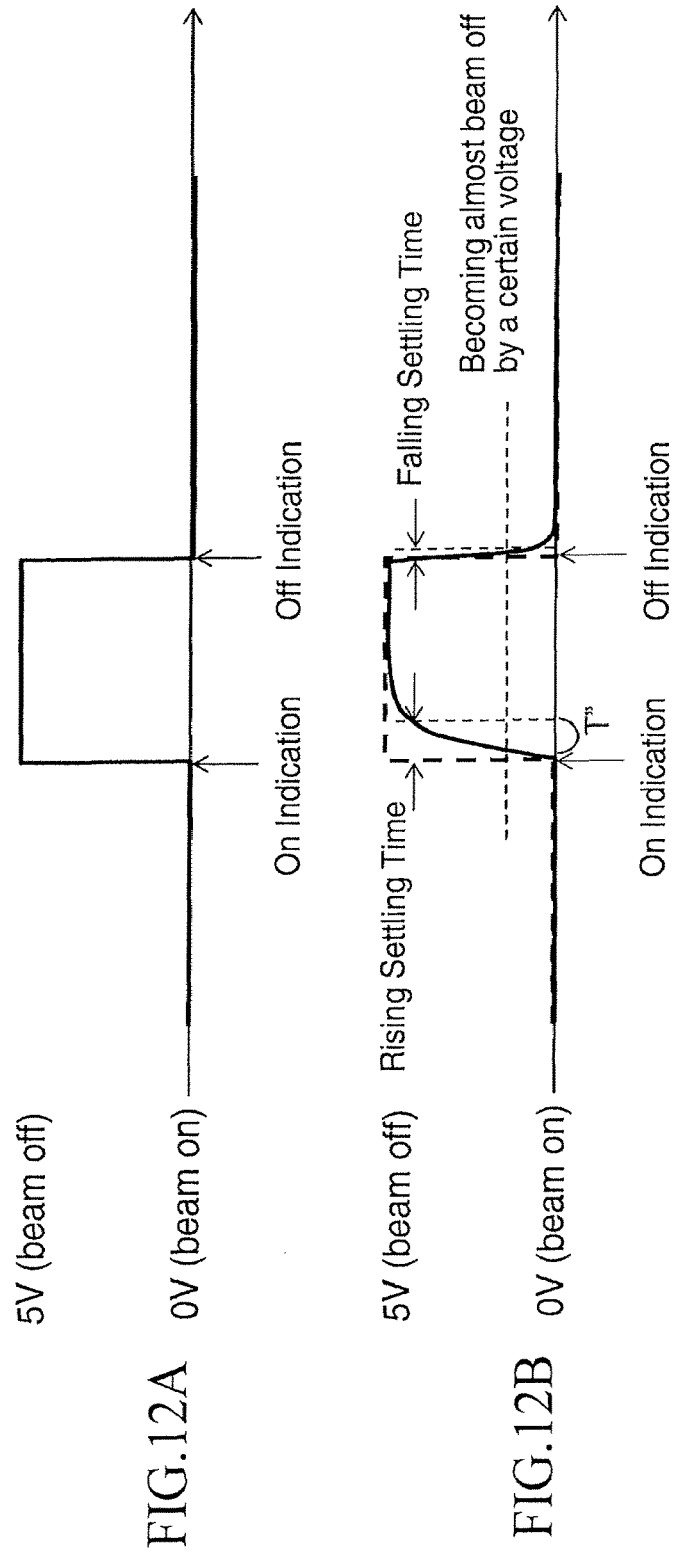
FIGS. 12A and 12B show examples of a blanking waveform of electric potential to be applied to a deflector according to the first embodiment.

FIGS. 12A and 12B show examples of a blanking waveform of electric potential to be applied to a deflector according to the first embodiment. In the individual blanking mechanism 47, a pair of electrodes 24 and 26 serves as a blanking deflector. In the common blanking mechanism, the common blanking deflector 212 serves as a blanking deflector. When performing electric potential switching from 0V (ground potential) to a positive electric potential (e.g., 5V) by a switching signal (on indication), ideally, it is more preferable that the electric potential becomes a positive electric potential (e.g., 5V) at just the moment of switching as shown in FIG. 12A. However, actually, as shown in FIG. 12B, the rising waveform does not rise instantaneously but rises gradually. Thus, a settling time at rise is needed. Moreover, when performing electric potential switching from a positive electric potential (e.g., 5V) to 0V (ground potential), ideally, it is more preferable that the electric potential becomes 0V at just the moment of switching as shown in FIG. 12A. However, actually, as shown in FIG. 12B, the falling waveform does not fall instantaneously but falls gradually. On the other hand, the threshold value for switching beam ON/OFF exists between 0V (ground potential) and the positive electric potential (e.g., 5V). Therefore, as shown in FIG. 12B, it is switched from beam ON to beam OFF before the potential rises to a positive electric potential (e.g., 5V). Similarly, it is switched from beam OFF to beam ON before the potential falls to 0V. Therefore, the beam ON time (irradiation time: exposure time) becomes long or short depending on a relation between the waveform change at potential rising and the waveform change at potential falling. In the case of FIG. 12B, the settling time at potential rising is longer than that at potential falling, and an actual irradiation time is shorter than an irradiation time on control.

Therefore, regardless of the above examples, when controlling the irradiation time, more accurate writing can be achieved by performing control using either one of the individual amplifier 46 and the common amplifiers 54 whose blanking error at the rise and fall of electric potential is smaller than the other one. Even so, blanking errors remain. Then, according to the first embodiment, such a blanking error is corrected in multi-beam writing. There is possibility for the actual irradiation time (exposure time) becoming long or short depending on a blanking error. According to the first embodiment, there will be described an example of configuration for correcting shortness when the irradiation time (exposure time) becomes short due to a blanking error. Although the case where the settling time of the common amplifier is shorter than that of the individual amplifier, and the exposure time is controlled using a common amplifier will be described, it is also possible to correct an offset time of the individual amplifier even in a reverse case.

FIGS. 13A and 13B show examples of a set of divided shots according to a comparative example of the first embodiment. For example, when a desired irradiation time is 63Δ, as shown in FIG. 13A, beam irradiation during the irradiation time of 63Δ can be achieved by combining divided shots whose irradiation time periods are 32Δ, 16Δ, 8Δ, 4Δ, 2Δ, and Δ. However, since a blanking error is included as described above, an actual irradiation time becomes shorter than 63Δ. Since, in divided shots, the irradiation time is defined by a gray scale value, the minimum unit is Δ. Then, in the comparative example, shortage of the irradiation time (exposure time) resulting from a blanking error is compensated/corrected by adding Δ, as an amount of a blanking error, to the irradiation time of 63Δ in order to set 64Δ as the irradiation time on control. However, in such a case, as shown in FIG. 13B, required divided shots become only one divided shot of 64Δ. While six blanking operations are needed in FIG. 13A, only one blanking operation is performed in FIG. 13B. Therefore, the amounts of occurring blanking errors may be different between FIGS. 13A and 13B. Accordingly, in the multi-beam writing employing a divided shot, if the method of the comparative example is used, it is difficult to correct deviation of the irradiation time (exposure time) resulting from a blanking error. Then, according to the first embodiment, by devising the method for selecting a set of divided shots, deviation of the irradiation time (exposure time) resulting from a blanking error can be corrected even with respect to the multi-beam writing employing a divided shot.

Figure 14:
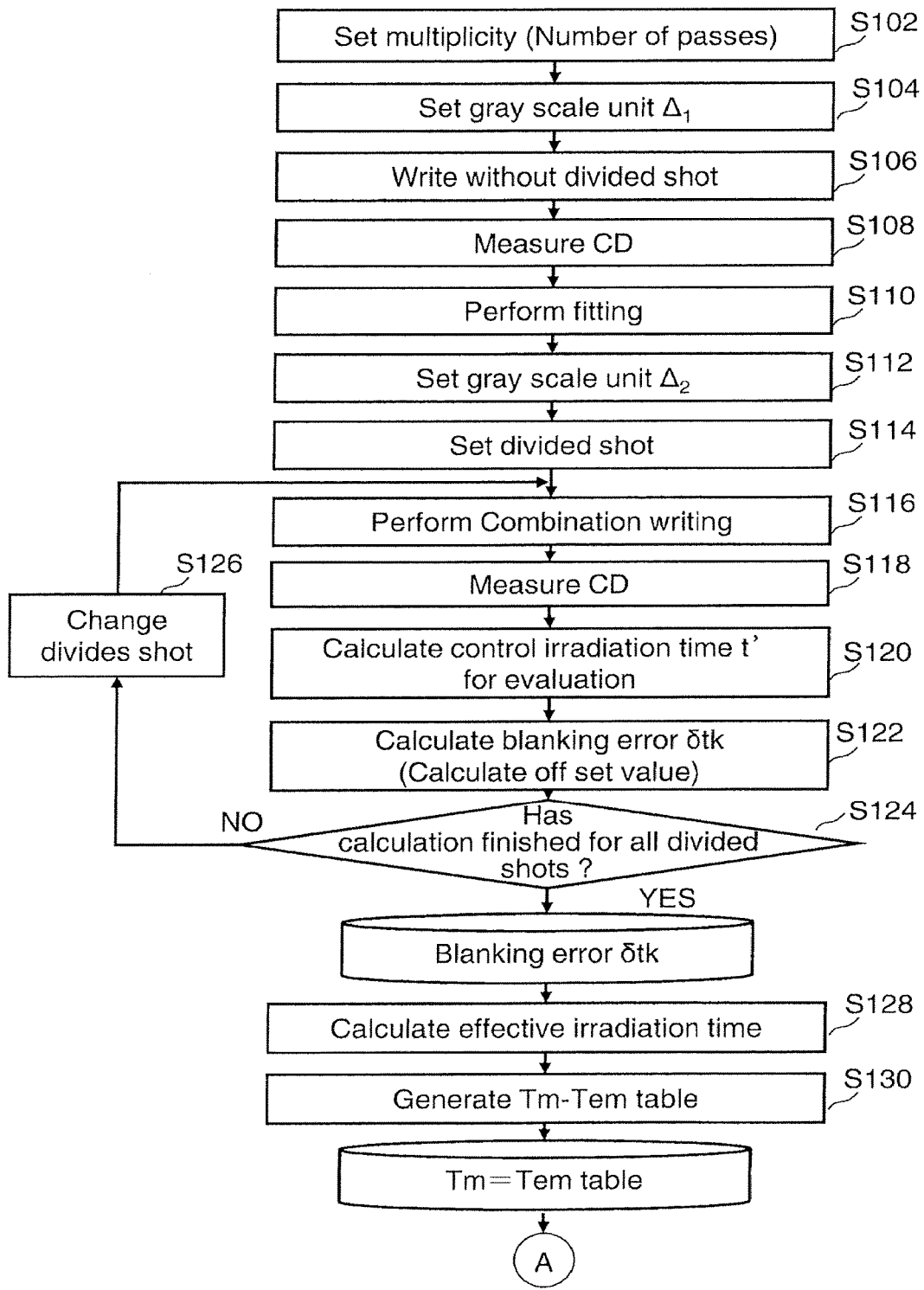
FIG. 14 is a flowchart showing a part of main steps of a writing method according to the first embodiment.

FIG. 14 is a flowchart showing a part of main steps of a writing method according to the first embodiment.

Figure 15:
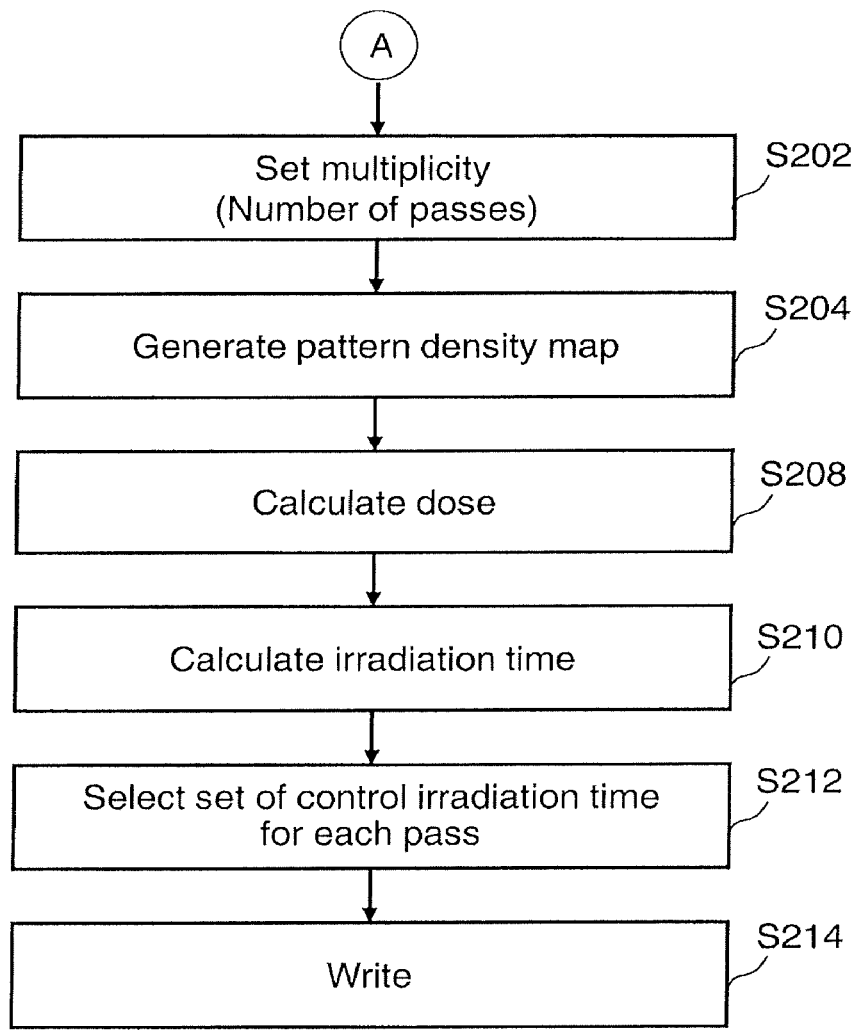
FIG. 15 is a flowchart showing the rest of the main steps of the writing method according to the first embodiment.

FIG. 15 is a flowchart showing the rest of the main steps of the writing method according to the first embodiment. In FIGS. 14 and 15, the writing method (the exposure method) of the first embodiment executes a series of steps: a multiplicity (number of passes) setting step (S102), a gray scale unit $\Delta_1$ setting step (S104), a writing without divided shots (writing without dividing) step (S106), a CD measuring step (S108), a fitting step (S110), a gray scale unit $\Delta_2$ setting step (S112), a divided shot setting step (S114), a combination writing step (S116), a CD measuring step (S118), a control irradiation time t' for evaluation calculation step (S120), a blanking error δtk calculation step (S122), a determining step (S124), a divided shot change step (S126), an effective irradiation time calculation step (S128), a Tm-Tem table generation step (S130), a multiplicity (number of passes) setting step (S202), a pattern density map generation step (S204), a dose calculation step (S208), an irradiation time calculation step (S210), a control irradiation time set selecting step (S212) for each pass, and a writing step (S214).

In the above series of steps, the following steps are main steps of a generation method of correlation data representing a relation between a control irradiation time and an effective irradiation time: the multiplicity (number of passes) setting step (S102), the gray scale unit $\Delta_1$ setting step (S104), the writing without divided shots step (S106), the CD measuring step (S108), the fitting step (S110), the gray scale unit $\Delta_2$ setting step (S112) the divided shot setting step (S114), the combination writing step (S116), the CD measuring step (S118), the control irradiation time t' for evaluation calculation step (S120), the blanking error δtk calculation step (S122), the determining step (S124), the divided shot change step (S126), the effective irradiation time calculation step (S128), and the Tm-Tem table generation step (S130). Preferably, the generation method of correlation data is performed before writing processing, as a preprocessing of the writing processing. First, the correlation data is generated.

In the multiplicity (number of passes) setting step (S102), the setting unit 70 sets a multiplicity (number of passes) used when performing multiple writing. For example, the multiplicity (number of passes) is set as 8. It is preferable to set the number of passes used in actually performing writing processing.

In the gray scale unit $\Delta_1$ setting step (S104), the setting unit 72 sets a quantization unit $\Delta_1$ used when performing writing (exposing) without divided shots (that is, writing (exposing) without dividing) to be described later. It is assumed that, in the case of a pattern density μ of 50%, for example, an evaluation pattern for measuring a line width critical dimension (CD) is written on the substrate for evaluation which is coated with resist having sensitivity to resolve a pattern of a desired dimension by irradiation of a 2 A beam for 15 μs. In other words, a threshold value model is assumed whose threshold is a value of dose equivalent to an irradiation time of 15 μs. The maximum irradiation dose of such a threshold value model is two times a threshold value. In that case, it is necessary to set the irradiation time in the range from 0 to 30 μs. If setting an irradiation time of 1023 gray levels at the maximum using n divided shots (e.g., 10 divided shots) defined by n bits (e.g., 10 bits), when writing with one pass (not multiple writing), the gray scale unit $\Delta_1$ (quantization unit) is Δ=30 ns approximately. The gray scale unit $\Delta_1$ serves as a quantization unit for defining the irradiation time by gray scale values.

In the writing without divided shots (exposing without divided shots) step (S106), the writing mechanism 150 performs writing processing by one irradiation per pixel 36 for a predetermined irradiation time without using a divided shot. Here, exposing by multi-beams (at least one beam of the multi-beams) without using a divided shot is performed onto the substrate for evaluation coated with resist having the sensitivity described above, by using a plurality of different control irradiation time t1, t2, . . . for evaluation (first control irradiation time for evaluation) each of which is sufficiently longer than the settling time used, in blanking control of each beam. The settling time used is a settling time of an amplifier for controlling the exposure time, especially, in the present Embodiment, the longer one of a voltage stabilization time at the rise and a voltage stabilization time at the fall in the common blanking operation.

As described later, it is necessary to measure CD of a formed pattern after actual writing. Therefore, in the writing without divided shots step (S106), writing is performed in the range not greatly far from a dose threshold value of the model described above. For example, respective evaluation patterns are written based on a plurality of control irradiation time t1, t2, . . . for evaluation, such as from 12 μs to 18 μs, around the irradiation time of 15 μs. For example, in the case of the gray scale unit $\Delta_1$=30 ns, it is set in the range from 382 $\Delta_1$ to 640 $\Delta_1$. As an evaluation pattern, it is preferable to use a line and space pattern, etc. whose pattern density ρ is 50%. Each pattern based on each control irradiation time for evaluation is written in a different region in one substrate for evaluation. However, it is not limited thereto, and a different evaluation substrate may be used for each control irradiation time for evaluation.

In writing an evaluation pattern, the same pixel is written by a corresponding one beam of multi-beams. If there is current variation among multi-beams, the evaluation pattern may be written by a single beam. The amount of current of a beam used for writing should have been calibrated.

After writing, developing processing (not shown) is performed, and a resist pattern is formed for each control irradiation time for evaluation. Alternatively, it is also preferable that etching is performed with respect to the underlying film (e.g., Cr film) by using a resist pattern as a mask, and then, ashing is performed to form a pattern of the underlying film.

In the CD measuring step (S108), a pattern dimension CD (first pattern dimension) of the evaluation pattern formed when exposing by multi-beams (at least one beam of the multi-beams) without using a divided shot is performed onto the evaluation substrate during a corresponding control irradiation time for evaluation is measured for each control irradiation time for evaluation, by using a plurality of different control irradiation time t for evaluation (first control irradiation time for evaluation) each of which is sufficiently longer than the settling time needed in blanking control of each beam. Specifically, a line width critical dimension (CD) of a resist pattern (or underlying film pattern) obtained by the writing without divided shots step (S106) and its subsequent developing processing, etc. is measured for each control irradiation time for evaluation by using a dimension measuring instrument. The information on a measured line width critical dimension (CD) for each control irradiation time for evaluation is input from the outside of the writing apparatus 100, and stored in the storage device 144.

In the fitting step (S110), the fitting unit 74 reads data on the line width critical dimension (CD) for each control irradiation time for evaluation from the storage device 144, and calculates an approximate expression of the line width critical dimension (CD) depending on the control irradiation time for evaluation by performing fitting processing.

Figure 16:
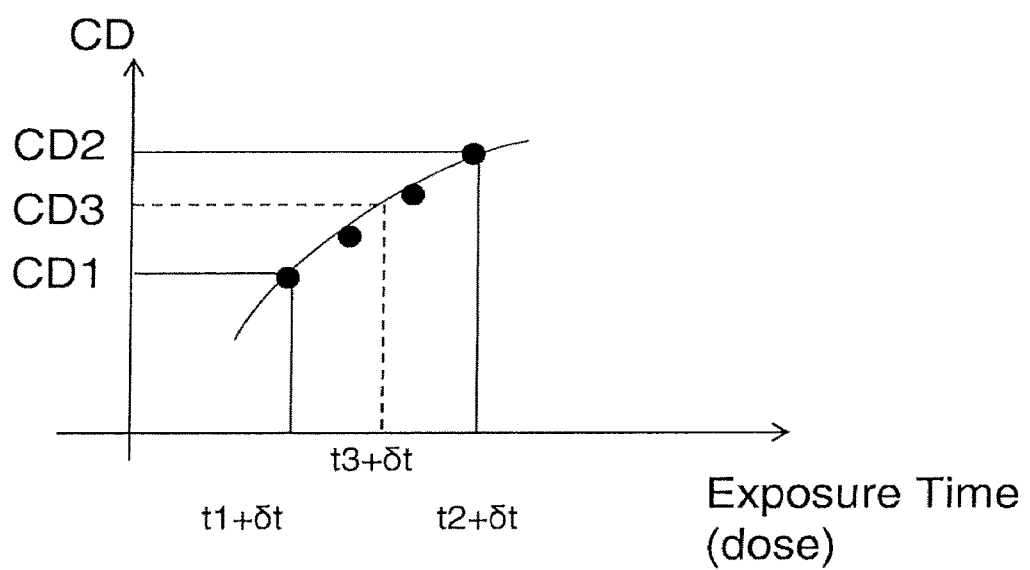
FIG. 16 shows an example of a graph approximating a line width critical dimension (CD) depending on a control irradiation time for evaluation according to the first embodiment.

FIG. 16 shows an example of a graph approximating a line width critical dimension (CD) depending on a control irradiation time for evaluation according to the first embodiment. In FIG. 16, the ordinate axis represents a CD value, and the abscissa axis represents a control irradiation time. As shown in FIG. 16, for example, the evaluation pattern dimension is CD1 at the control irradiation time t1 for evaluation, and the evaluation pattern dimension is CD2 at the control irradiation time t2 for evaluation. However, in writing without using a divided shot, since one blanking operation has already been performed, a blanking error δt generated in the one blanking operation is included. Therefore, the actual irradiation time (effective irradiation time), at which the pattern dimension CD1 is obtained, is a sum of the control irradiation time t1 for evaluation and the blanking error δt. As described later, if the irradiation time in one blanking operation is sufficiently longer than a settling time in performing a blanking control, the blanking error δt is a constant value. Therefore, the actual irradiation time (effective irradiation time), at which the pattern dimension CD2 is obtained, is a sum of the control irradiation time t2 for evaluation and the blanking error δt described above.

Thus, using the control irradiation time t which is sufficiently longer than the settling time in performing blanking controlling and the blanking error δt, the pattern dimension CD can be defined by the following equation (1) using a function f.

$$CD=f(t+\delta t) \quad (1)$$

In FIG. 16, the control irradiation time t' between the control irradiation time t1 and the control irradiation time t2 is defined by the following equation (2).

$$t'=t3+tk\times m \quad (2)$$

The control irradiation time t3 is set to be sufficiently longer than the settling time of the blanking mechanism in which writing processing without using a divided shot can be performed. The sub control irradiation time tk is a control irradiation time of a divided shot having been set in a plurality of divided shots, which will be described later. The number of times, m, is the number of times of repeating the set-up divided shot. The control irradiation time t3 and the number of times, m, are adjusted so that the total control irradiation time t' in the case of performing the set-up divided shot and performing one shot of writing processing without using a divided shot may become between the control irradiation time t1 and the control irradiation time t2 (t1<t'<t2).

In the case of performing beam irradiation by one shot of writing processing without using a divided shot during the control irradiation time t', since the blanking error δt is included, the actual irradiation time (effective irradiation time) is (t'+δt). Moreover, in the case of performing beam irradiation by one shot of writing processing without using a divided shot during the control irradiation time t3, since the blanking error δt is included, the actual irradiation time (effective irradiation time) is (t3+δt). Further, in the case of performing beam irradiation by one divided shot during the sub control irradiation time tk, since the blanking error δtk for the divided shot is included, the actual irradiation time (effective irradiation time) is (tk+δtk). Therefore, if defining the equation (2) by an effective irradiation time, it can be transformed into the following equation (3).

$$t'+\delta t=(t3+\delta t)+(tk+\delta tk)\times m \quad (3)$$

Accordingly, the CD obtained as a result of writing based on the effective irradiation time of the right side {(t3+δt)+ (tk+δtk)×m} of the equation (3), and the CD obtained as a result of writing based on the effective irradiation time of the left side (t'+δt) of the equation (3) should be coincide with each other. Therefore, the evaluation pattern is written during the effective irradiation time of the right side {(t3+ δt)+(tk++δtk)×m} of the equation (3), and then, using an obtained result, the control irradiation time t' is estimated based on the approximate expression of FIG. 16.

If the control irradiation time t' is obtained, the blanking error δtk for the divided shot can be calculated by the following equation (4) transformed from the equation (3).

$$\delta tk = (t'-t3)/m - tk \quad (4)$$

That is, δtk can be obtained without calculating δt.

In the gray scale unit $\Delta_2$ setting step (S112), the Δ setting unit 72 sets a gray scale unit (quantization unit) Δ2 used in the case of performing actual writing processing. In the multiplicity (number of passes) setting step (S102), if it is set to perform actual writing processing by using, for example, eight passes, the gray scale unit Δ2 can be calculated as a value obtained by dividing the gray scale unit Δ1 by the number of passes. Therefore, for example, when $\Delta_1$=30 ns, $\Delta_2$=4 ns approximately. This means that the minimum control irradiation time of the divided shot is $\Delta_2$ (=4 ns). This value is smaller than the settling time needed in the blanking processing. Thus, in the divided shot, it is greatly affected by deviation of a blanking waveform occurred during the settling time in the blanking processing. Hereinafter, the blanking error δtk occurred in each of a plurality of divided shots is calculated.

In the divided shot setting step (S114), the divided shot setting unit 76 sets one divided shot k as a target for calculating a blanking error δtk in a plurality of divided shots (e.g., ten divided shots where k=0, . . . , 9,).

In the combination writing step (S116), the writing mechanism 150 performs writing of the evaluation pattern by combining exposing by the multi-beams (at least one beam of the multi-beams) without using a divided shot during the control irradiation time t3 (second control irradiation time for evaluation) sufficiently longer than the settling time, and exposing by the multi-beams (at least one beam of the multi-beams) using a divided shot by repeating, a plurality of times, a target divided shot in a plurality of divided shots. In other words, the writing mechanism 150 performs combination writing by combining one shot without using a divided shot during the control irradiation time t3 per pixel 36, and consecutive shots emitted m times each during the sub control irradiation time tk. The combination exposure by multi-beams is performed onto the substrate for evaluation coated with resist having the sensitivity described above.

For example, when selecting a divided shot of the sub control irradiation time tk=Δ2 (=4 ns), if setting t3=440Δ1 (=13200 ns) and m=200 times, the total control irradiation time can be 440Δ1+Δ2×200=13 μs. For example, when selecting a divided shot of the sub control irradiation time tk=2Δ2 (=8 ns), if setting t3=440Δ1 (=13200 ns) and m=100 times, the total control irradiation time can be 440Δ1+2Δ2×100=14 μs. For example, when selecting a divided shot of the sub control irradiation time tk=4Δ2 (=16 ns), if setting t3=440Δ1 (=13200 ns) and m=100 times, the total control irradiation time can be 440Δ1+4Δ2×100=14.8 μs. For example, when selecting a divided shot of the sub control irradiation time tk=8Δ2 (=32 ns), if setting t3=440Δ1 (=13200 ns) and m=100 times, the total control irradiation time can be 440Δ1+8Δ2×100=16.4 μs. Since, if the number of repeating, m, becomes small, the averaging effect also becomes small, it is preferable not to reduce the number of repeating, m. Preferably, for example, m≥5. More preferably, m≥50. Furthermore preferably, m≥100. When m≥100, if the total control irradiation time exceeds t2 (e.g., 18 μs) of FIG. 16, t3 should be reduced. For example, when selecting a divided shot of the sub control irradiation time tk=16Δ2 (=64 ns), if setting t3=300Δ1 (=13200 ns) and m=100 times, the total control irradiation time can be 300Δ1+16Δ2× 100=15.4 μs. Similarly, hereinafter, t3 and m may be set up to the sub control irradiation time tk=512Δ2 (=2048 ns).

In the CD measuring step (S118), it is carried out to measure a pattern dimension CD (second pattern dimension) formed when performing, on the evaluation substrate, combination of exposing without using a divided shot during the control irradiation time t3 (second control irradiation time for evaluation) which is sufficiently longer than the settling time, and exposing using a divided shot by repeating, a plurality of times, a target divided shot in a plurality of divided shots.

Specifically, a line width critical dimension (CD) of a resist pattern (or underlying film pattern) obtained by the combination writing step (S116) and its subsequent developing processing, etc. is measured using a dimension measuring instrument. The information on a measured line width critical dimension (CD) of the combination writing is input from the outside of the writing apparatus 100, and stored in the storage device 144.

In writing an evaluation pattern, the same pixel is written by a corresponding one beam of multi-beams. If there is current variation among multi-beams, the evaluation pattern may be written by a single beam.

After writing, developing processing (not shown) is performed, and a resist pattern is formed for each control irradiation time for evaluation. Alternatively, it is also preferable that etching is performed with respect to the underlying film (e.g., Cr film) by using a resist pattern as a mask, and then, ashing is performed to form a pattern of the underlying film.

In the control irradiation time t' for evaluation calculation step (S120), the t' calculation unit 78 approximates a control irradiation time t' for evaluation (third control irradiation time for evaluation) based on which the pattern dimension CD (second pattern dimension) obtained by the combination writing is acquired, using a result of the pattern dimension CD (first pattern dimension CD) measured for each of the control irradiation time t1 and t2 for evaluation (first control irradiation time for evaluation). In other words, a control irradiation time t' for evaluation corresponding to the line width critical dimension (CD) obtained by the combination writing combining the target divided shots measured in the CD measuring step (S118) is calculated using the approximate expression acquired in the fitting step (S110).

In the blanking error δtk calculation step (S122), the $\delta_{tk}$ calculation unit 80 calculates a blanking error time $\delta_{tk}$ with respect to a target divided shot by using a control irradiation time t3 (second control irradiation time for evaluation), a control irradiation time t' for evaluation (third control irradiation time for evaluation), a sub control irradiation time tk of a target divided shot, and the number of repeating, m, of the target divided shot. Specifically, the $\delta_{tk}$ calculation unit 80 calculates a blanking error time $\delta_{tk}$ with respect to a target divided shot by putting the value of each parameter into the equation (4).

In the determining step (S124), the determination unit 82 determines whether the blanking error time δtk has been calculated for all the divided shots. When the blanking error time δtk has not been calculated for all the divided shots yet, it proceeds to the divided shot change step (S126). When the blanking error time δtk has already been calculated for all the divided shots, it proceeds to the effective irradiation time calculation step (S128).

In the divided shot change step (S126), the divided shot setting unit 76 resets another divided shot, being different from the current set divided shot, with respect to which the blanking error time δtk has not been calculated yet. After resetting, it returns to the combination writing step (S116), and executes repeatedly each step from the divided shot change step (S126) to the determining step (S124) until the blanking error time δtk has been calculated for all the divided shots.

FIG. 17 is a table showing a blanking error time δtk with respect to each divided shot according to the first embodiment. In FIG. 17, bits from 0 to 9 show divided shots whose sub irradiation time are from $2^0 \cdot \Delta 2$ $(=\Delta 2)$ to $2^9 \cdot \Delta 2$ $(=512\Delta 2)$. In FIG. 17, the blanking error time δtk are negative values. In the case of the negative value, it is indicated that the actual irradiation time (effective irradiation time) is shorter than the set control irradiation time.

Figure 18:
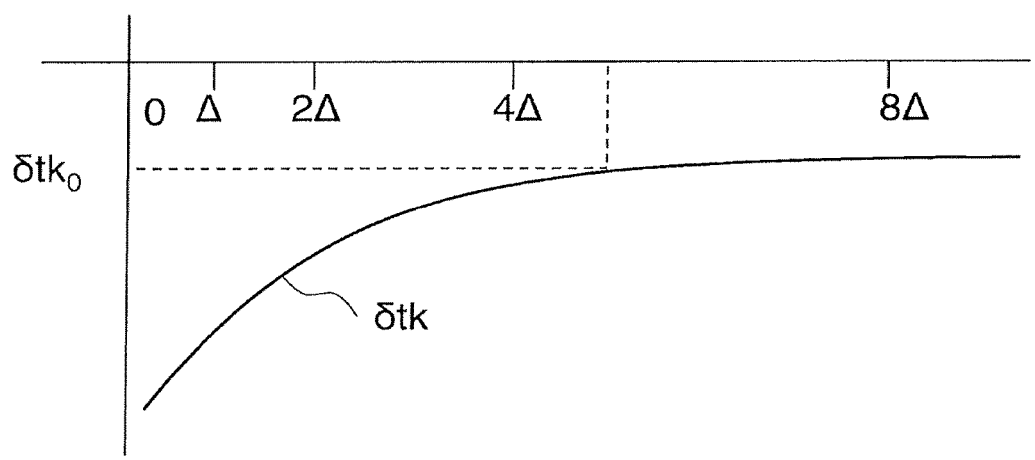
FIG. 18 is a graph showing change of a blanking error time δtk with respect to each divided shot according to the first embodiment.

FIG. 18 is a graph showing change of a blanking error time δtk with respect to each divided shot according to the first embodiment. As shown in FIG. 18, as the control irradiation time becomes long, the blanking error time δtk converges on a constant value $\delta tk_0$. In the example of FIG. 18, the sub control irradiation time tk converges between 4Δ $(=4 \cdot \Delta 2)$ and 8Δ $(=8 \cdot \Delta 2)$. If the sub control irradiation time tk is shorter than the settling time (e.g., T" of FIG. 12B) in blanking processing of the writing apparatus 100, the blanking error time δtk changes, and if it is longer than the settling time, the blanking error time δtk converges on a constant value $\delta tk_0$. A longer one in the potential stabilization time at the rise and the potential stabilization time at the fall is used as the settling time.

Although, in the example described above, the blanking error time δtk is calculated for each of a plurality of divided shots, it is also preferable that the blanking error time δtk is calculated only for a divided shot of the sub control irradiation time tk shorter than the settling time in a plurality of divided shots. Thereby, the time spent on preprocessing can be shortened.

In the effective irradiation time calculation step (S128), the effective irradiation time (Tem) calculation unit 84 calculates an effective irradiation time Tem for each of a plurality of control irradiation time periods Tm for controlling an irradiation time of each beam in the multi-beams 20 of an electron beam. Specifically, in the case where the irradiation position of each beam in the multi-beams 20 of each pass which indicates each exposure processing in multiple exposure is exposed during a control irradiation time Tm being a corresponding desired irradiation time by continuously performing a combination of divided shots selected from the plurality of divided shots bk each having any one of a plurality of sub control irradiation time periods tk preset and being corresponding to the desired irradiation time onto the same irradiation position, the Tem calculation unit 84 calculates the effective irradiation time Tem by using a pre-acquired blanking error time δtk of each divided shot bk, which is independent of the beam position of the multi-beams, due to an error of blanking control for each divided shot.

FIG. 19 is a chart showing a relation among a control irradiation time, an effective irradiation time, and a set/combination of divided shots according to the first embodiment. For example, when the control irradiation time Tm is Δ $(=\Delta 2)$, only the divided shot (b0) whose sub control irradiation time tk is Δ $(=\Delta 2)$ becomes ON, and other divided shots are OFF (not to be executed). Therefore, there occurs a blanking error time δtk=−0.7Δ $(=−0.7\Delta 2)$ of the divided shot (b0). Thus, the effective irradiation time Tem is 0.3Δ $(=\Delta−0.7\Delta)$ obtained adding the blanking error time δtk to the control irradiation time Δ. For example, when the control irradiation time is 2Δ $(−2\Delta 2)$, only the divided shot (b1) whose sub control irradiation time tk is 2Δ $(=2\Delta 2)$ becomes ON, and other divided shots are OFF (not to be executed). Therefore, there occurs a blanking error time δtk=−0.4Δ $(=−0.4\Delta 2)$ of the divided shot (b1). Thus, the effective irradiation time Tem is 1.6Δ $(=2\Delta−0.4\Delta)$ obtained by adding the blanking error time δtk to the control irradiation time 2Δ. Similarly, hereinafter, the effective irradiation time Tem up to 1023Δ of the control irradiation time are calculated. For example, when the control irradiation time Tm is 1023Δ $(=1023\Delta 2)$, all the divided shots (b0 to b9) whose sub control irradiation time tk is Δ $(=\Delta 2)$ become ON. Therefore, the total of the blanking error time δtk of divided shots (b0 to b9) to occur is −0.7Δ−0.4Δ−0.3Δ−0.2Δ−0.2Δ−0.2Δ−0.2Δ−0.2Δ−0.2Δ−0.2Δ $(=−2.8\Delta 2)$. Accordingly, the effective irradiation time Tem becomes 1020.2Δ $(=1023\Delta−2.8\Delta)$ obtained by adding the blanking error time δtk to the control irradiation time 1023Δ. The divided shot selected in each control irradiation time is selected sequentially from the divided shot bk having the longest sub irradiation time, as much as possible.

In the Tm-Tem table generation step (S130), the table generation unit 86 generates correlation data representing a relation between the control irradiation time Tm and the effective irradiation time Tem. Specifically, the table generation unit 86 generates a Tm-Tem table showing a relation among a control irradiation time, an effective irradiation time, and a set/combination of divided shots shown in FIG. 19. In the Tm-Tem table, the part of set of divided shots in FIG. 19 may be omitted. The generated Tm-Tem table is stored in the storage device 144. Actual writing processing is carried out using this Tm-Tem table.

Figure 20:
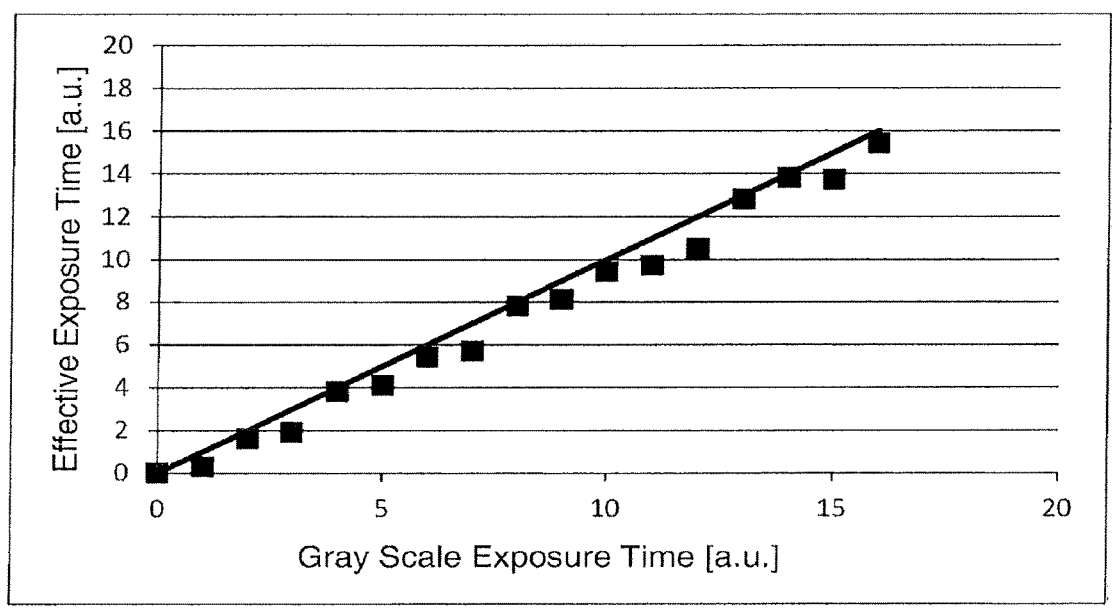
FIG. 20 is a graph showing a relation between a gray scale exposure time and an effective exposure time according to the first embodiment.

FIG. 20 is a graph showing a relation between a gray scale exposure time and an effective exposure time according to the first embodiment. In FIG. 20, the ordinate axis represents an effective exposure time (effective irradiation time/Δ), and the abscissa axis represents a gray scale exposure time (control exposure time/Δ). As shown in FIG. 20, when the blanking error time δtk is a negative value, the effective exposure time (effective irradiation time/Δ) is insufficient with respect to the gray scale exposure time (control exposure time/Δ). Then, according to the first embodiment, the error of the exposure time resulting from the blanking error time δtk is corrected.

In the multiplicity (number of passes) setting step (S202), the setting unit 70 sets the multiplicity (number of passes) which is used when writing processing is performed. For example, the number of passes is set as eight.

In the pattern density map generation step (S204), the pattern area density ρ calculation unit 60 reads writing data from the storage device 140, and calculates, for each pixel 36, a pattern area density ρ in the pixel 36 concerned.

In the dose calculation step (S208), the dose D calculation unit 62 calculates, for each pixel (writing pixel) 36, a dose D with which the pixel 36 concerned is irradiated. For example, the dose D can be calculated by multiplying a pre-set base dose $D_{base}$, a proximity effect correction irradiation coefficient $D_p$, and a pattern area density ρ. Thus, it is preferable to obtain the dose D to be in proportion to a pattern area density calculated for each pixel 36. With respect to the proximity effect correction irradiation coefficient $D_p$, the writing region (here, for example, stripe region 32) is virtually divided into a plurality of proximity mesh regions (mesh regions for proximity effect correction calculation) by a predetermined size. The size of the proximity mesh region is preferably about 1/10 of the influence range of the proximity effect, such as about 1 μm. Then, writing data is read from the storage device 140, and, for each proximity mesh region, a pattern area density ρ' of a pattern arranged in the proximity mesh region concerned is calculated.

Next, the dose D calculation unit 62 calculates, for each proximity mesh region, a proximity effect correction irradiation coefficient $D_p$ for correcting a proximity effect. Here, the size of the mesh region to calculate the proximity effect correction irradiation coefficient $D_p$ does not need to be the same as that of the mesh region to calculate a pattern area density ρ'. Moreover, the correction model of the proximity effect correction irradiation coefficient $D_p$ and its calculation method may be the same as those used in the conventional single beam writing system.

In the irradiation time calculation step (S210), the irradiation time t calculation unit 64 calculates, for each pixel 36, an electron beam irradiation time t for making the calculated dose D incident on the pixel 36 concerned. The irradiation time t can be calculated by dividing the dose D by a current density J. Then, an irradiation time t map which defines the irradiation time t acquired for each pixel 36 is generated. The generated t map is stored in the storage device 142.

In the control irradiation time set selecting step (S212) for each pass, the selection unit 65 selects, by using a Tm-Tem table (correlation data), for each irradiation position of the target object 101, a set/combination of divided shots corresponding to an effective irradiation time Tem to be closer to a desired irradiation time. For example, as shown in FIG. 19, when the number of passes is one (not performing multiple writing) and a desired irradiation time is 15Δ, according to the Tm-Tem table, 15.8Δ which is the effective irradiation time in the case of the control irradiation time Tm being 16Δ is closer to the desired irradiation time 15Δ than 13.4Δ which is the effective irradiation time in the case of the control irradiation time Tm being 15Δ. Therefore, in such a case, the selection unit 65 selects the set (b1, b4) of the divided shots corresponding to the effective irradiation time (15.8Δ) being closer to the desired irradiation time.

When performing multiple writing, the set of divided shots is selected for each pass which indicates each exposure processing performed in multiple exposure. In such a case, the set of divided shots of each pass is selected so that the total of the effective irradiation time Tem obtained by the set of the divided shots selected for each pass may become closer to a desired irradiation time for all the passes in the multiple exposure. For example, when the desired irradiation time is 64Δ, if it is eight passes, generally, 8Δ (the first pass), 8Δ (the second pass), 8Δ (the third pass), 8Δ (the fourth pass), 8Δ (the fifth pass), 8Δ (the sixth pass), 8Δ (the seventh pass), and 8Δ (the eighth pass) are selected as the control irradiation time Te. However, in that case, the total of the effective irradiation time Tem becomes 62.4Δ. On the other hand, if 9Δ (the first pass), 9Δ (the second pass), 9Δ (the third pass), 8Δ (the fourth pass), 9Δ (the fifth pass), 9Δ (the sixth pass), 9Δ (the seventh pass), and 8Δ (the eighth pass), that is six 9Δ and two 8Δ, are selected as the control irradiation time Te, the total of the effective irradiation time Tem can be 64.2Δ (=8.1Δ×6+7.8Δ×2). Therefore, for example, when the desired irradiation time is 64Δ, if it is eight passes, the selection unit 65 selects six 9Δ and two 8Δ as the control irradiation time Te. Thereby, the effective irradiation time can be closer to the desired irradiation time.

In the writing step (S214), the writing mechanism 150 (exposure unit) performs exposure (writing), using the multi-beams 20, based on a set of divided shots selected for each irradiation position of the target object 101. Therefore, first, the data processing unit 66 generates, for each pass and for each pixel 36, an ON/OFF signal (irradiation time data) in binary numbers, for example, so that one set of divided shots corresponding to a selected control irradiation time Te may be identified. In the example of FIG. 9, for example, with respect to the pixel 36 whose irradiation time is 1023Δ, since all the divided shots are selected for the irradiation time data of the pixel concerned, it is "1111111111". Regarding the order of arrangement of the divided shots, it may be set as appropriate, however, it is preferable to define such that divided shots are arranged, for example, in descending order of the irradiation time. For example, if the pixel 36 needs an irradiation time of 960Δ, since $960=2^9+2^8+2^7+2^6$, a set of a divided shot with the irradiation time of $2^9\Delta$, a divided shot with the irradiation time of $2^8\Delta$, a divided shot with the irradiation time of $2^7\Delta$, and a divided shot with the irradiation time of $2^6\Delta$ is selected. Therefore, the irradiation time data of this pixel 36 is "1111000000".

Next, the transmission control unit 68 transmits irradiation time data to the deflection control circuit 130 in order of shots. The deflection control circuit 130 outputs, for each divided shot, an ON/OFF control signal of each of the multi-beams 20 to the blanking aperture array mechanism 204 (blanking device). Specifically, the deflection control circuit 130 outputs, for each shot, an ON/OFF control signal to the control circuit 41 for each beam in the blanking aperture array mechanism 204.

Shift registers in the control circuits 41 for beams in the same row, for example, in p×q multiple beams are connected in series. For example, irradiation time data (ON/OFF control signal) of divided shots of beams in the same row in the p×q multiple beams are transmitted in series. Then, the transmitted irradiation time data of each beam is stored in a corresponding shift register 40 by p clock signals totally, for example.

Then, responsive to input of a read signal from the deflection control circuit 130, the individual register 42 reads and stores an ON/OFF signal, based on the stored k-th shot data (1 bit). Moreover, irradiation time data (10 bits) of the k-th shot is transmitted from the deflection control circuit 130, and stored in the register 50 for common blanking control.

Next, an individual shot signal of the k-th shot is output from the deflection control circuit 130 to the individual registers 44 of all the beams. Thereby, the individual register 44 for each beam maintains data stored in the individual register 42 only during the time of the individual shot signal being in the ON condition, and outputs a beam ON signal or a beam OFF signal to the individual amplifier 46 in accordance with a maintained ON/OFF signal. Instead of the individual shot signal, a load signal for keeping loading and a reset signal for resetting stored information may be output to the individual register 44. The individual amplifier 46 applies a beam ON voltage or a beam OFF voltage to the control electrode 24 in accordance with the input beam ON signal or beam OFF signal. On the other hand, when controlling the irradiation time by the common blanking mechanism, after the individual shot signal, a common shot signal of the k-th shot is output from the deflection control circuit 130 to the counter 52 for common blanking control. The counter 52 performs counting only during the time indicated by the ON/OFF control signal stored in the register 50, and, during this period, outputs a beam ON signal to the common amplifier 54. The common amplifier 54 applies a beam ON voltage to the deflector 212 only during the time of inputting a beam ON signal from the counter 52.

As described above, exposure of the target pixel 36 is carried out by continuously performing selected divided shots. In the case of multi-pass writing (multiple exposure), the writing region 30 is generally exposed by performing, for each pass, divided shots of each pixel while shifting the stripe region 32. In such a case, for each pass, each pixel is exposed with a different beam.

With respect to a blanking waveform and a blanking error δtk, they change depending on X-ray irradiation and/or electron beam irradiation. Therefore, it is preferable to periodically update the value of the Tm-Tem table. By performing the updating, change of the blanking error δtk (blanking offset) can be corrected.

As described above, the shift registers 40 in the control circuits 41 for beams in the same row, for example, in p×q multiple beams are connected in series. Therefore, a control signal and a power are supplied to each control circuit 41 from right and left (x direction, and −x direction), for example, of the blanking aperture array mechanism 204. Accordingly, the blanking error δtk (blanking offset) may be different from each other for each amplifier 46 arranged in the serial direction. Therefore, it is also preferable to generate the Tm-Tem table for each individual blanking mechanism 47 of the multi-beams. Alternatively, it is also preferable to generate the Tm-Tem table for each group composed of individual blanking mechanisms 47 arranged in the direction orthogonal to the flowing direction of a control signal and a power.

Thus, according to the first embodiment, the blanking error δtk in multi-beam exposure can be corrected as described above. Therefore, a pattern of highly accurate dimension can be written.

Embodiments have been explained referring to concrete examples described above. However, the present invention is not limited to these specific examples. While it has been described the case where a group of divided shots having mutually different exposure time periods is used, it is not limited thereto. Divided shots of the same exposure time may mixedly exist in the group of divided shots.

Moreover, in the example described above, since the blanking error δtk is measured as a negative value, the control irradiation time is insufficient with respect to the desired irradiation time, and therefore, it should be corrected to compensate the insufficiency as much as possible. However, there may be a case where the blanking error δtk is a positive value. In such a case, since the control irradiation time becomes over-exposure, it may be corrected such that an excessive amount is reduced as much as possible.

While the apparatus structure, control method, and the like not directly necessary for explaining the present invention are not described, some or all of them can be selectively used case-by-case basis. For example, although description of the structure of the control circuit for controlling the writing apparatus 100 is omitted, it should be understood that some or all of the structure of the control circuit can be selected and used appropriately when necessary.

In addition, any other multi charged particle beam exposure method and multi charged particle beam exposure apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam exposure method comprising:
   calculating an effective irradiation time, in a case where an irradiation position of each beam in multi-beams of each pass which indicates each exposure processing in multiple exposure is exposed during a control irradiation time being a desired irradiation time by continuously performing a combination of divided shots selected from a plurality of divided shots each having any one of a plurality of sub control irradiation time periods preset and being corresponding to the control irradiation time onto a same irradiation position, for each of a plurality of control irradiation time periods for controlling an irradiation time of each beam in the multi-beams of a charged particle beam, using a blanking error time of each divided shot of the plurality of divided shots, previously acquired, due to an error of blanking control for the each divided shot;
   generating correlation data which represents a relation between the control irradiation time and the effective irradiation time;
   selecting, using the correlation data, for each irradiation position of a target object, the combination of the divided shots corresponding to the effective irradiation time to be closer to the each desired irradiation time; and
   performing exposure, using the multi-beams, based on the combination of the divided shots selected for the each irradiation position of the target object.

2. The method according to claim 1, wherein
the combination of the divided shots is selected for the each pass which indicates the each exposure processing in the multiple exposure, and selected so that a total of the effective irradiation time obtained by the combination of the divided shots selected for the each pass becomes closer to a desired irradiation time for all passes in the multiple exposure.

3. The method according to claim 1, further comprising:
measuring a first pattern dimension of an evaluation pattern formed in a case of performing exposing by at least one beam of the multi-beams without using a divided shot, onto an evaluation substrate during each of a plurality of first control irradiation time periods for evaluation, each of which is different from each other and sufficiently longer than a settling time needed in the blanking control of the each beam;
measuring a second pattern dimension of the evaluation pattern formed in a case of performing combination of exposing by the at least one beam of the multi-beams without using a divided shot during a second control irradiation time for evaluation which is sufficiently longer than the settling time, and exposing by the at least one beam of the multi-beams using a target divided shot in the plurality of divided shots by repeating a plurality of times, onto the evaluation substrate;
approximating a third control irradiation time for evaluation based on which the second pattern dimension is obtained, using a result of the first pattern dimension measured for the each of the plurality of first control irradiation time periods for evaluation; and
calculating the blanking error time with respect to the target divided shot by using the second control irradiation time for evaluation, the third control irradiation time for evaluation, the control irradiation time of the target divided shot, and a number of repeating the target divided shot.

4. The method according to claim 3, wherein the blanking error time is calculated for a divided shot whose control irradiation time is shorter than the settling time in the plurality of divided shots.

5. The method according to claim 3, further comprising:
setting a multiplicity (number of passes) used in performing the multiple exposure.

6. The method according to claim 5, further comprising:
setting, by a gray scale value, a quantization unit for defining an irradiation time in a case of performing the exposing without using a divided shot.

7. The method according to claim 6, further comprising:
performing the exposing without using a divided shot to a pixel which serves as a unit irradiation region by irradiation of one beam shot without a divided shot during the each of the plurality of first control irradiation time for evaluation, using an evaluation pattern.

8. A multi charged particle beam exposure apparatus comprising:
an effective irradiation time calculation circuit configured to calculate an effective irradiation time, in a case where an irradiation position of each beam in multi-beams of each pass which indicates each exposure processing in multiple exposure is exposed during a control irradiation time being a desired irradiation time by continuously performing a combination of divided shots selected from a plurality of divided shots each having any one of a plurality of sub control irradiation time periods preset and being corresponding to the control irradiation time onto a same irradiation position, for each of a plurality of control irradiation time periods for controlling an irradiation time of each beam in the multi-beams of a charged particle beam, using a blanking error time of each divided shot of the plurality of divided shots, previously acquired, due to an error of blanking control for the each divided shot;
a generation circuit configured to generate correlation data which represents a relation between the control irradiation time and the effective irradiation time;
a selection circuit configured to select, using the correlation data, for each irradiation position of a target object, the combination of the divided shots corresponding to the effective irradiation time to be closer to the each desired irradiation time; and
an exposure mechanism configured to perform exposure, using the multi-beams, based on the combination of the divided shots selected for the each irradiation position of the target object.

9. The apparatus according to claim 8, wherein
the combination of the divided shots is selected for the each pass which indicates the each exposure processing in the multiple exposure, and
the selection circuit selects the combination of the divided shots for the each pass so that a total of the effective irradiation time obtained by the combination of the divided shots selected for the each pass becomes closer to a desired irradiation time for all passes in the multiple exposure.

10. The apparatus according to claim 8, further comprising:
a storage device configured to store
a first pattern dimension of an evaluation pattern formed in a case of performing exposing by at least one beam of the multi-beams without using a divided shot, onto an evaluation substrate during each of a plurality of first control irradiation time for evaluation, each of which is different from each other and sufficiently longer than a settling time needed in the blanking control of the each beam, and
a second pattern dimension of the evaluation pattern formed in a case of performing combination of exposing by the at least one beam of the multi-beams without using a divided shot during a second control irradiation time for evaluation which is sufficiently longer than the settling time, and exposing by the at least one beam of the multi-beams using a target divided shot in the plurality of divided shots by repeating a plurality of times, onto the evaluation substrate; and
a control irradiation time calculation circuit for evaluation configured to approximate a third control irradiation time for evaluation based on which the second pattern dimension is obtained, using a result of the first pattern dimension measured for the each of the plurality of first control irradiation time for evaluation.

* * * * *